United States Patent
Otani et al.

(10) Patent No.: US 11,982,631 B2
(45) Date of Patent: May 14, 2024

(54) DEFECT DETECTION DEVICE, DEFECT DETECTION METHOD, AND DEFECT OBSERVATION APPARATUS INCLUDING DEFECT DETECTION DEVICE

(71) Applicant: Hitachi High-Tech Corporation, Tokyo (JP)

(72) Inventors: Yuko Otani, Tokyo (JP); Kazuo Aoki, Tokyo (JP); Shunichi Matsumoto, Tokyo (JP); Yuta Urano, Tokyo (JP)

(73) Assignee: HITACHI HIGH-TECH CORPORATION, Tokyo (JP)

( * ) Notice: Subject to any disclaimer, the term of this patent is extended or adjusted under 35 U.S.C. 154(b) by 321 days.

(21) Appl. No.: 17/437,528

(22) PCT Filed: Mar. 12, 2019

(86) PCT No.: PCT/JP2019/009933
§ 371 (c)(1),
(2) Date: Sep. 9, 2021

(87) PCT Pub. No.: WO2020/183601
PCT Pub. Date: Sep. 17, 2020

(65) Prior Publication Data
US 2022/0155240 A1    May 19, 2022

(51) Int. Cl.
*G01N 21/95* (2006.01)
*G01N 21/88* (2006.01)
(Continued)

(52) U.S. Cl.
CPC ..... *G01N 21/9501* (2013.01); *G01N 21/8806* (2013.01); *G01N 21/8851* (2013.01); *G02B 3/0006* (2013.01); *G02B 5/20* (2013.01)

(58) Field of Classification Search
CPC .......... G01N 21/8806; G01N 21/8851; G01N 21/9501; G01N 21/95623; H01L 22/12;
(Continued)

(56) References Cited

U.S. PATENT DOCUMENTS

| 5,867,736 A | 2/1999 | Jantz |
| 10,634,890 B1 * | 4/2020 | Kasten ............... G02B 21/0032 |

(Continued)

FOREIGN PATENT DOCUMENTS

| JP | 2011106974 A | 6/2011 |
| JP | 2012127848 A | 7/2012 |

(Continued)

OTHER PUBLICATIONS

Search Report dated Jun. 11, 2019 in International Application No. PCT/JP2019/009933.
(Continued)

*Primary Examiner* — Peter B Kim
(74) *Attorney, Agent, or Firm* — Miles & Stockbridge, P.C.

(57) ABSTRACT

A defect detection device including an illumination optical system, an image capturing optical system configured to capture an image of scattered light generated by the illumination optical system irradiating the wafer, and an image processing unit configured to process a picture of the image of the scattered light to extract a defect on the wafer. The image capturing optical system includes an objective lens, a filter unit configured to shield a part of light transmitted through the objective lens, and an imaging lens configured to form an image of light transmitted through the filter unit. The filter unit includes a first microlens array configured to condense parallel light transmitted through the objective lens, a shutter array including a light transmission unit at a focus position of the first microlens array, and a second microlens array disposed opposite to the first microlens array with respect to the shutter array.

13 Claims, 17 Drawing Sheets

(51) Int. Cl.
*G02B 3/00* (2006.01)
*G02B 5/20* (2006.01)

(58) Field of Classification Search
CPC .. G02B 21/0016; G02B 21/14; G02B 21/361; G02B 21/365; G02B 3/0006; G02B 5/20
See application file for complete search history.

(56) References Cited

U.S. PATENT DOCUMENTS

| | | |
|---|---|---|
| 2006/0012872 A1 | 1/2006 | Hayashi et al. |
| 2012/0274931 A1 | 11/2012 | Otani et al. |
| 2013/0277553 A1 | 10/2013 | Otani et al. |
| 2014/0354983 A1 | 12/2014 | Kolchin et al. |

FOREIGN PATENT DOCUMENTS

| | | | |
|---|---|---|---|
| JP | 2013168559 A | 8/2013 | |
| JP | 2016528478 A | 9/2016 | |
| WO | 2004036284 A1 | 4/2004 | |
| WO | WO-2019153225 A1 * | 8/2019 | ............. G02B 6/293 |

OTHER PUBLICATIONS

Written Opinion dated Jun. 11, 2019 in International Application No. PCT/JP2019/009933.

* cited by examiner

[FIG. 1]
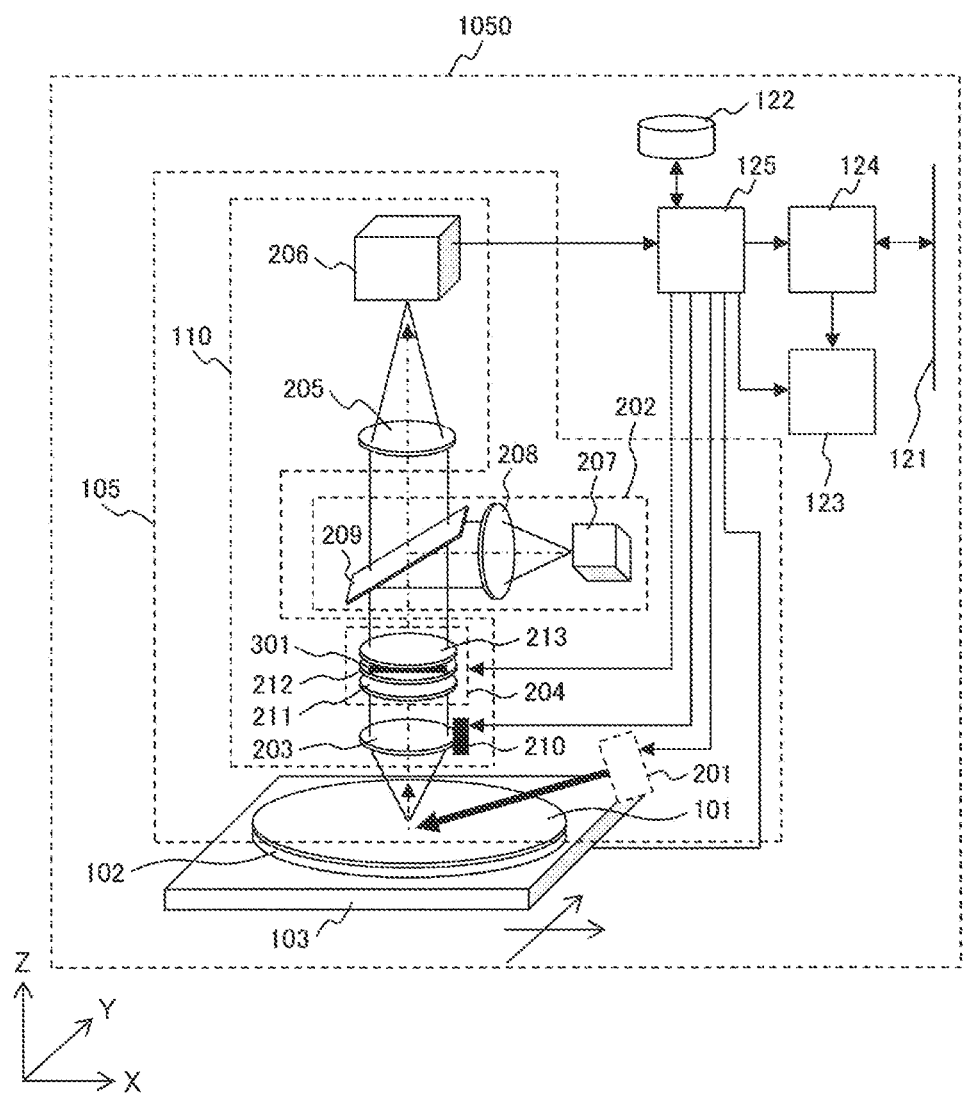

[FIG. 2]
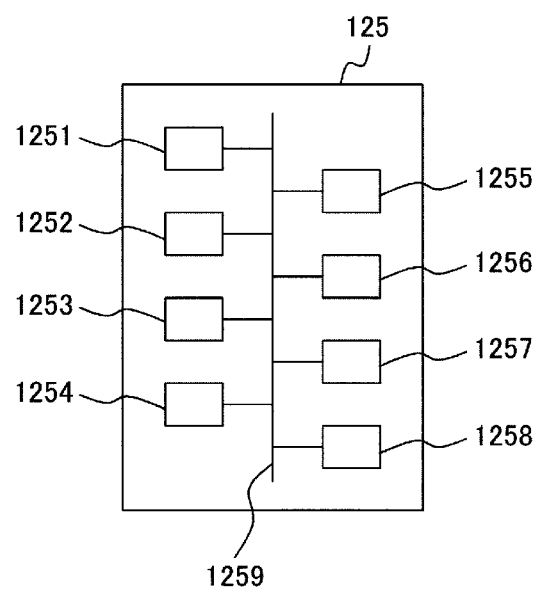

[FIG. 3]
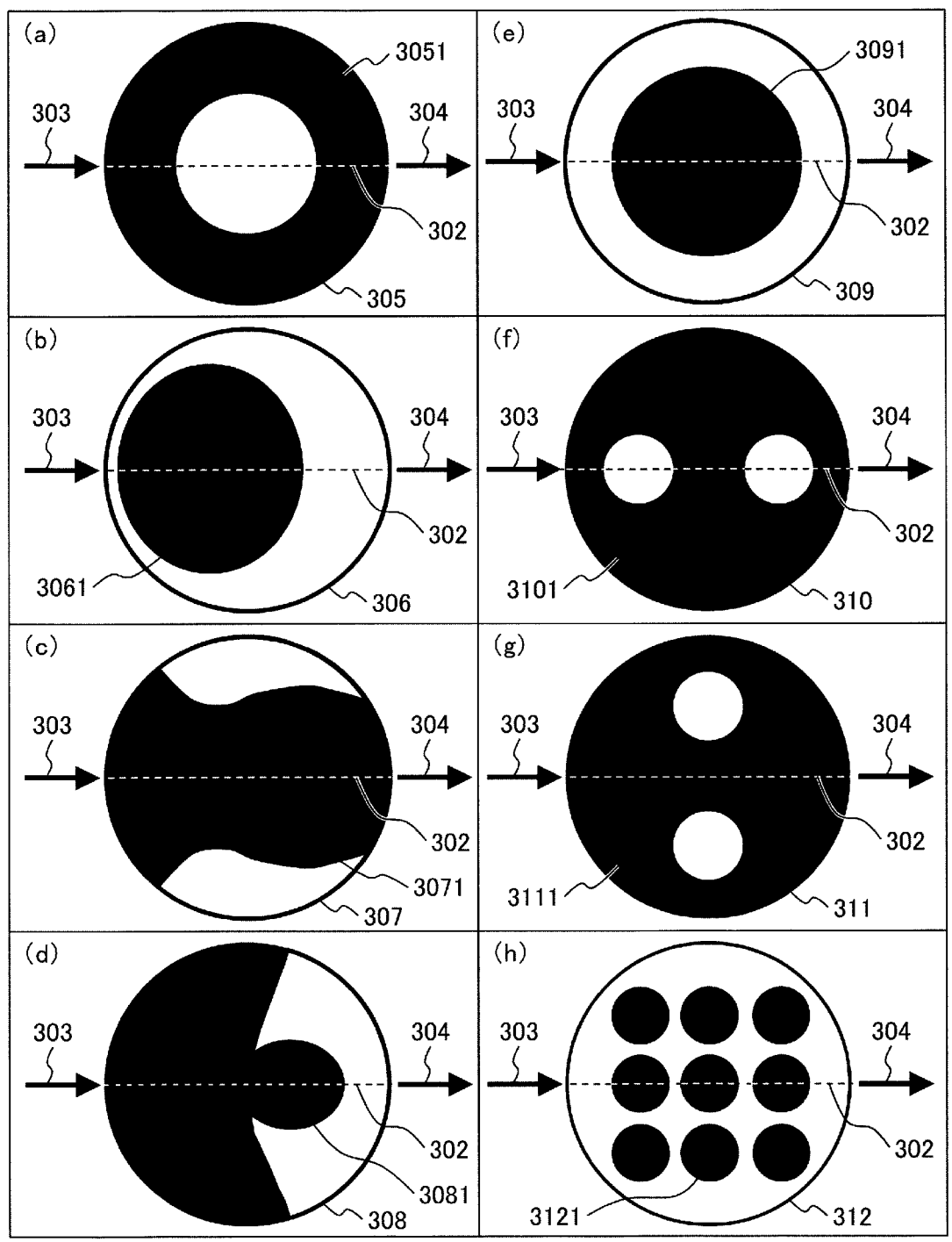

[FIG. 4]
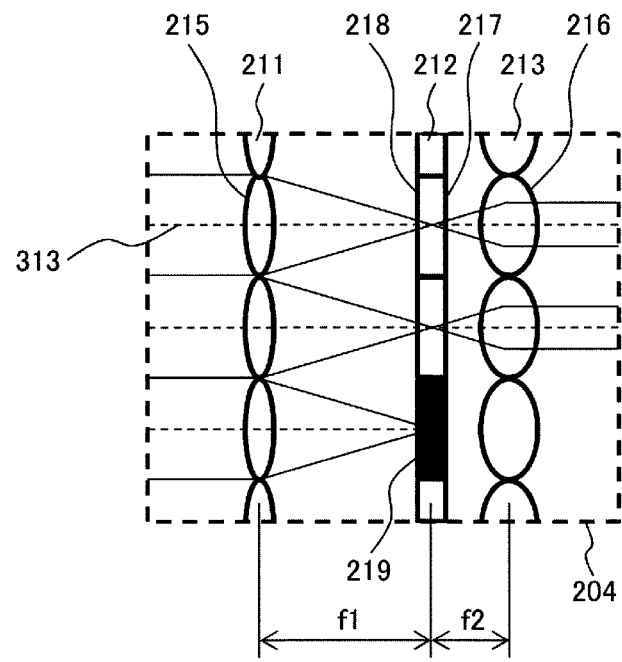
[FIG. 5]
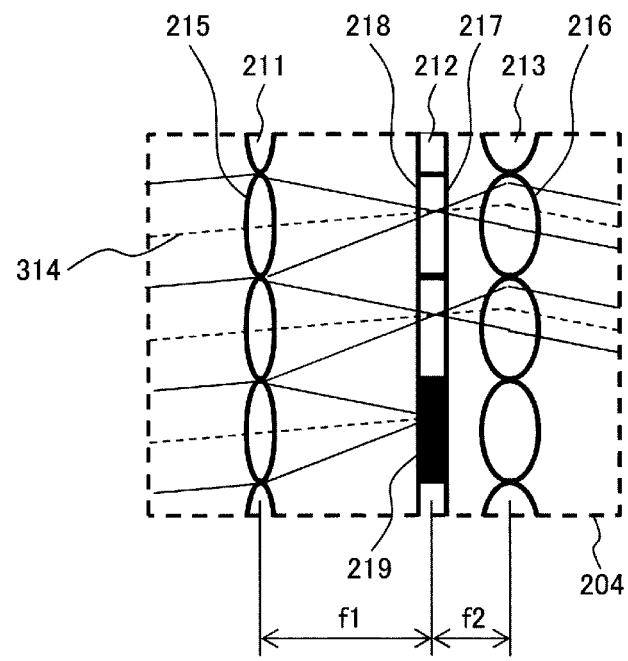

[FIG. 6]
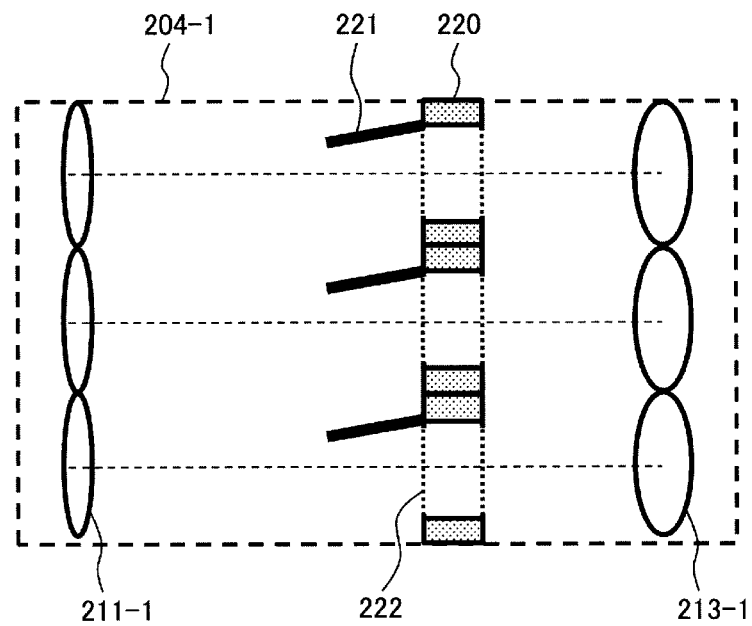
[FIG. 7]
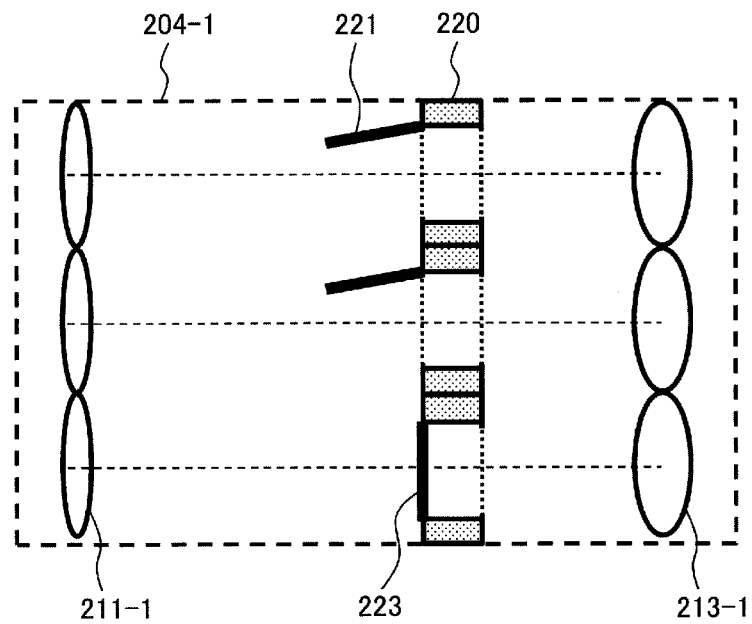

[FIG. 8]
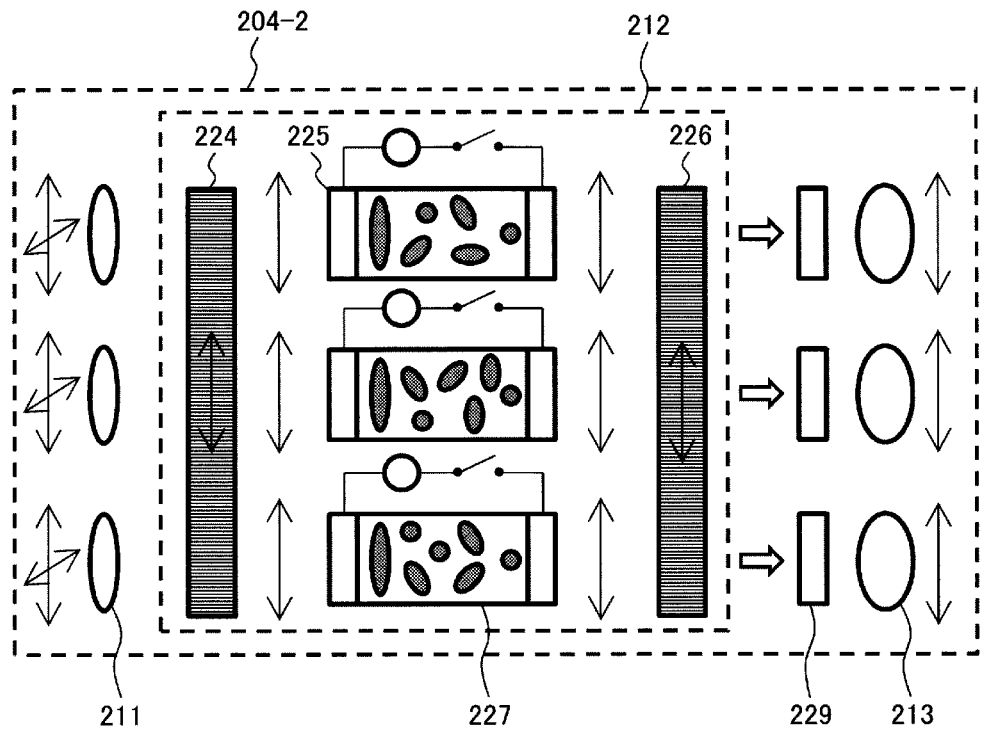
[FIG. 9]
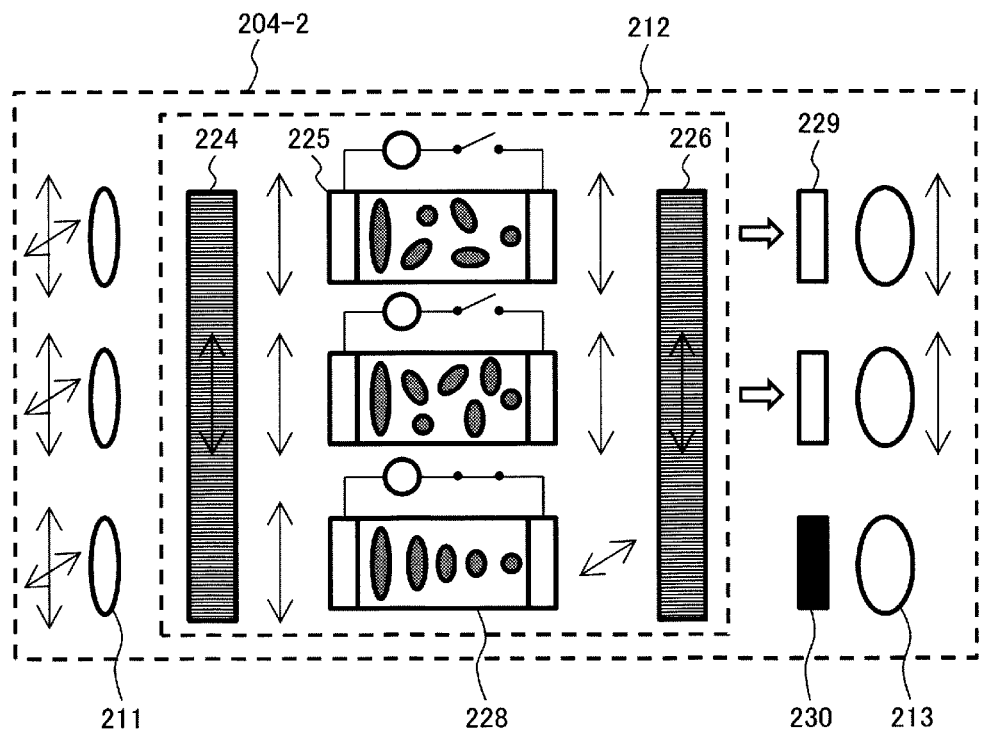

[FIG. 10]
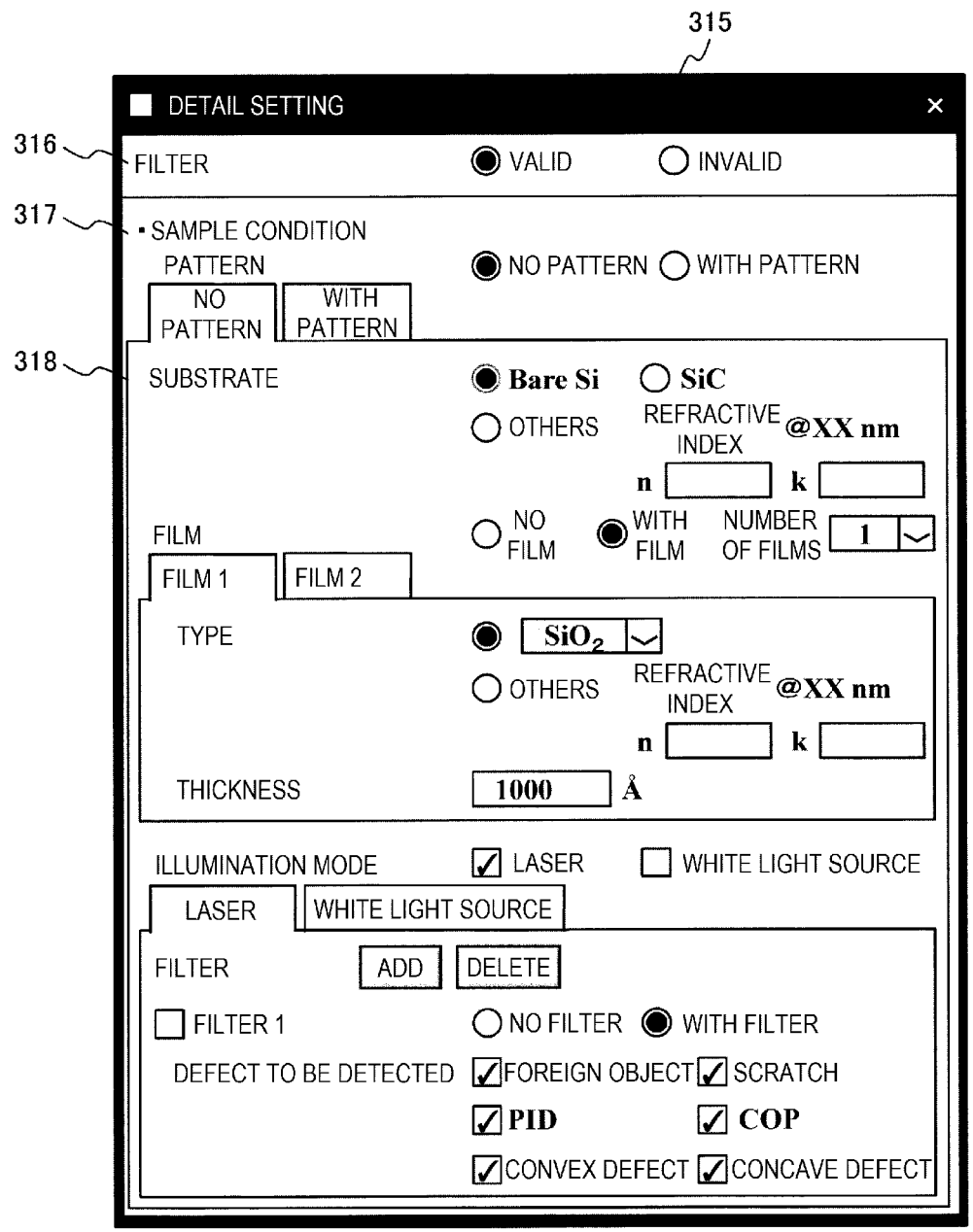

[FIG. 11]
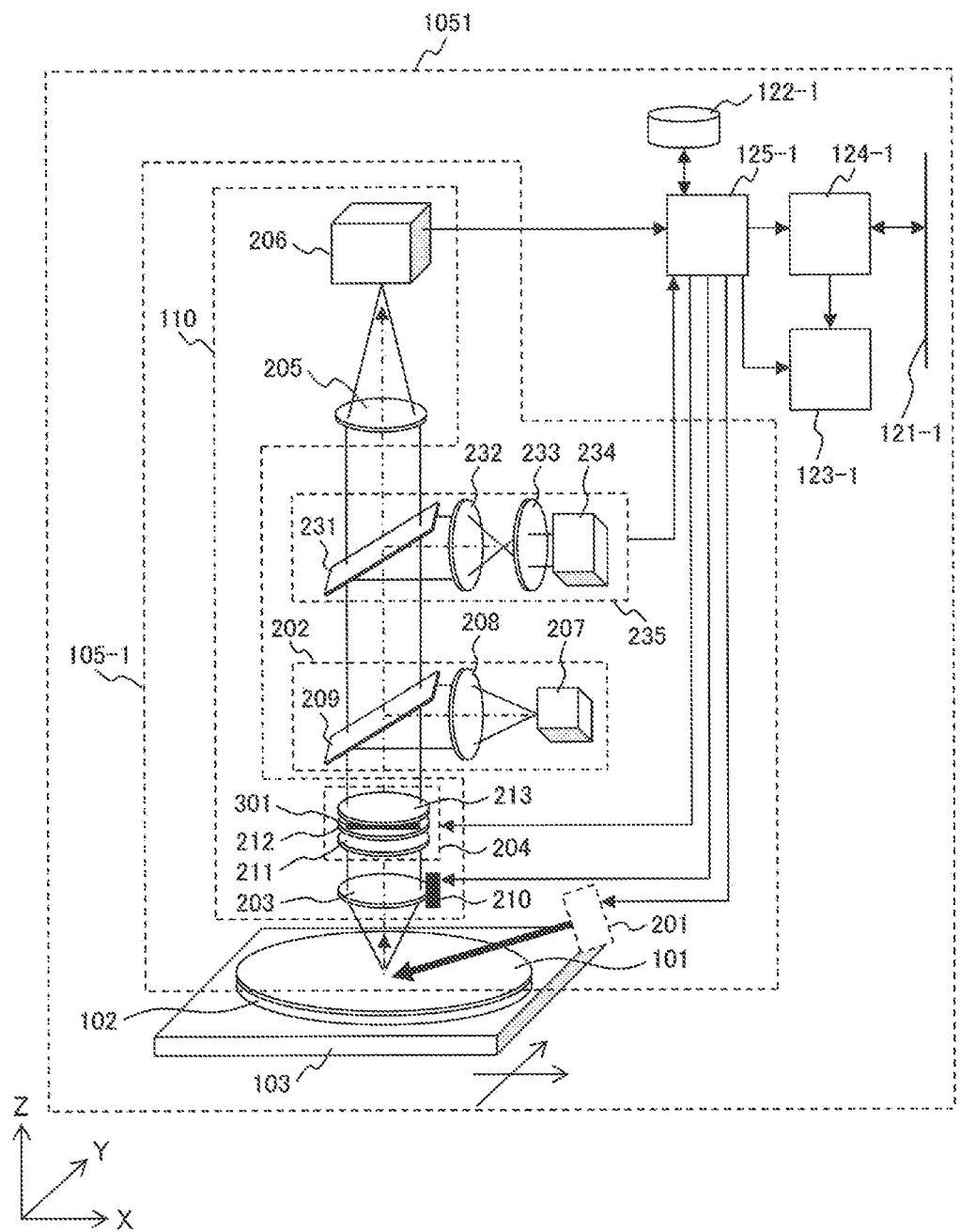

[FIG. 12]
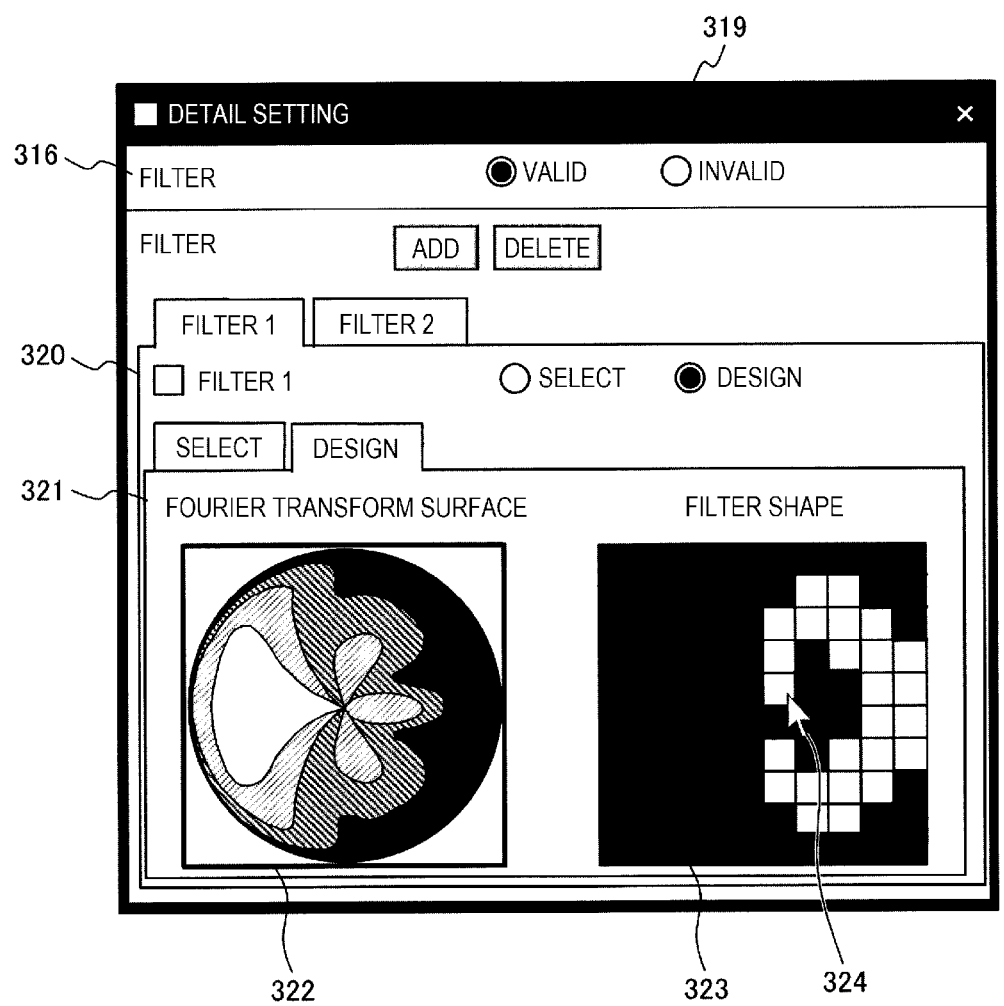

[FIG. 13]
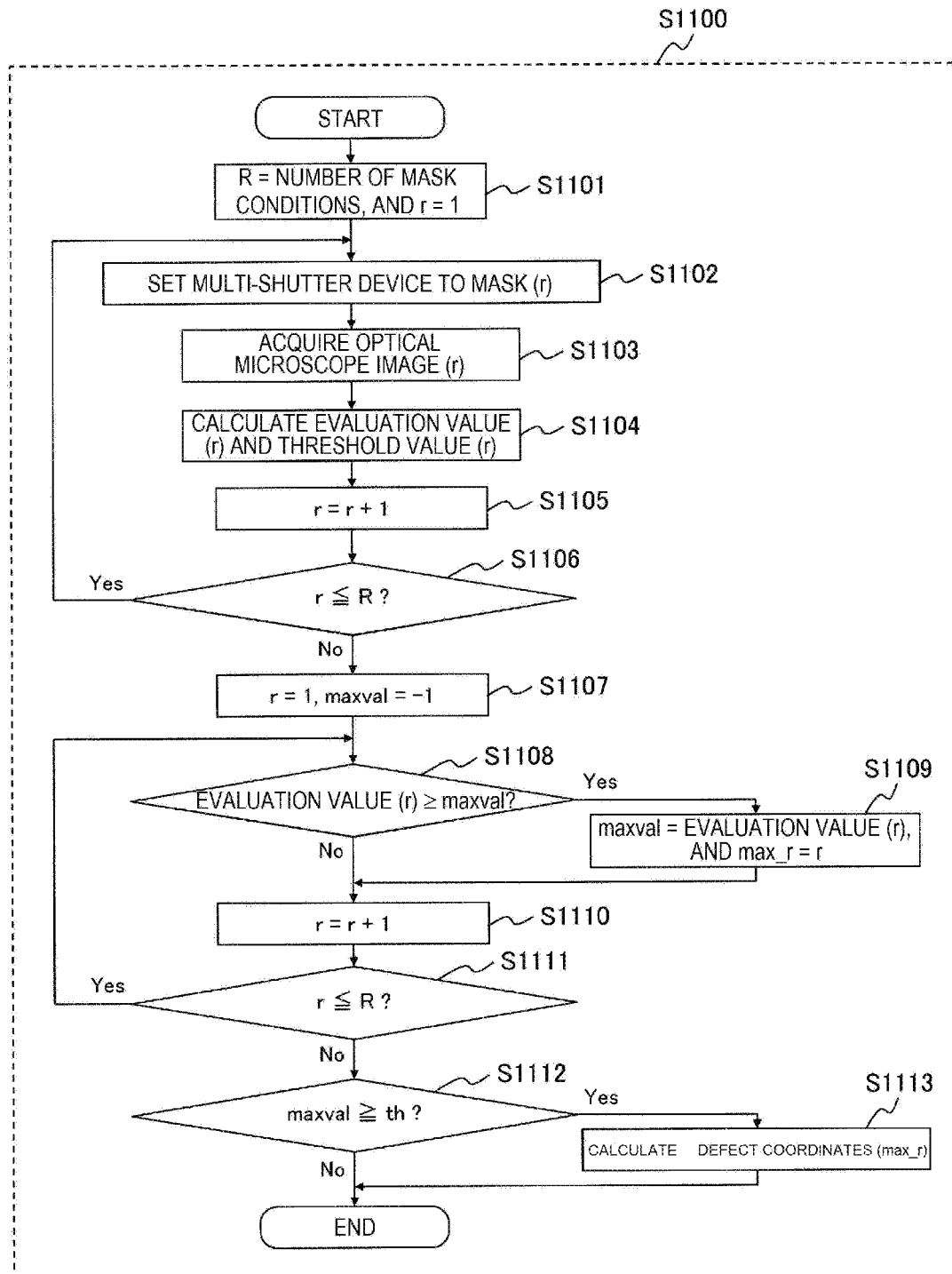

[FIG. 14]
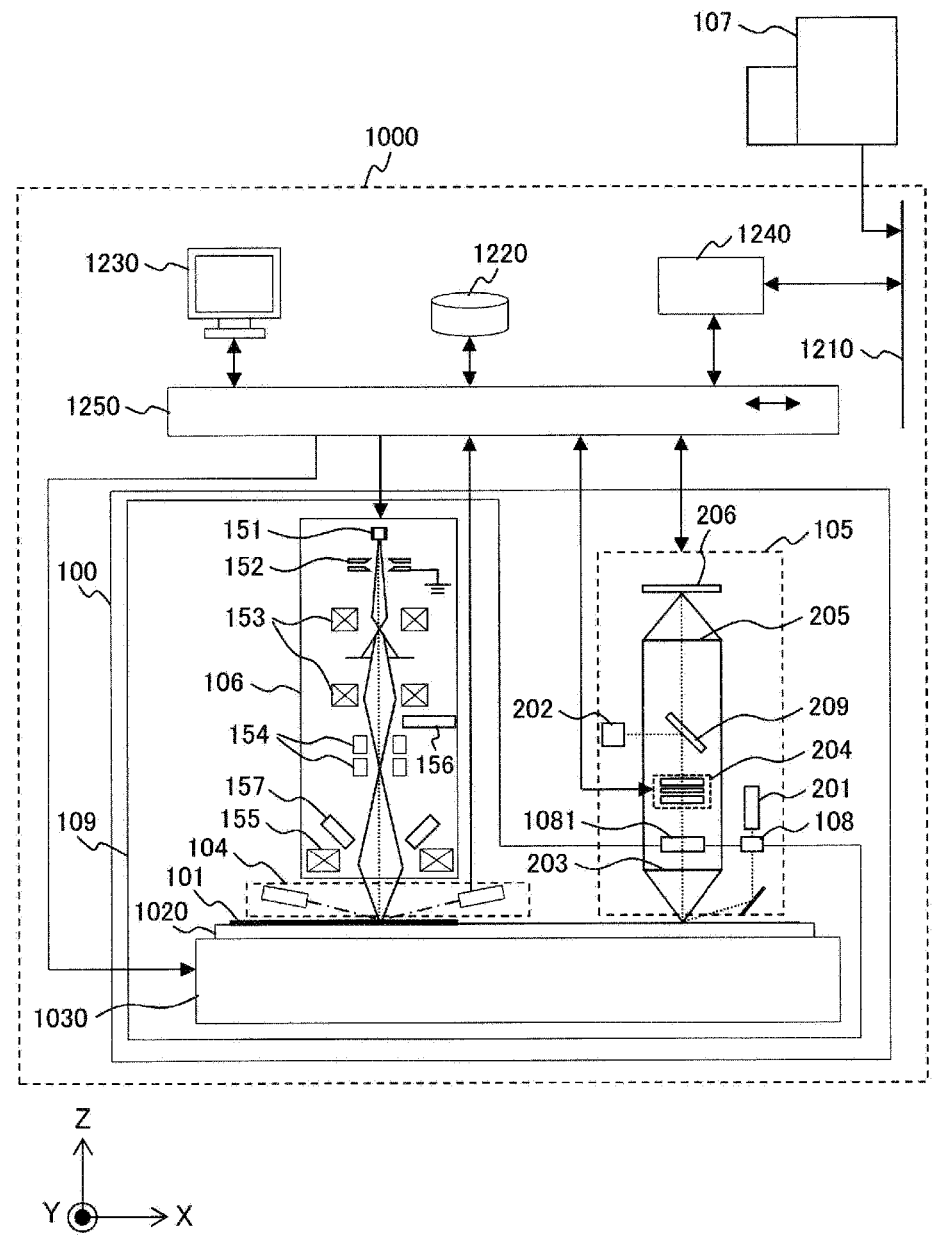

[FIG. 15]
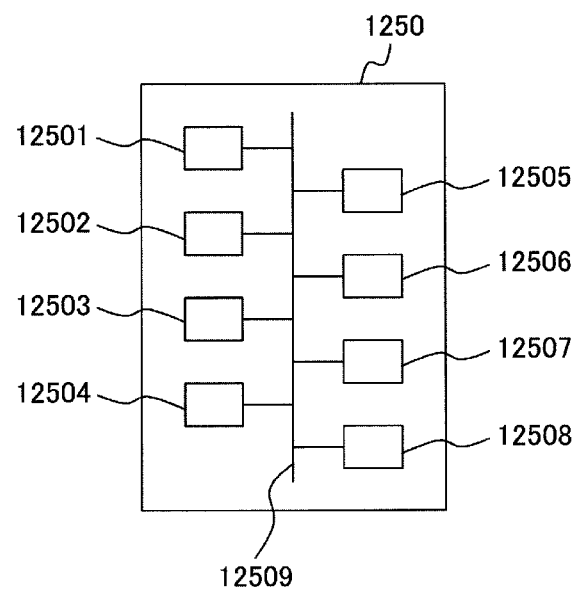

[FIG. 16]
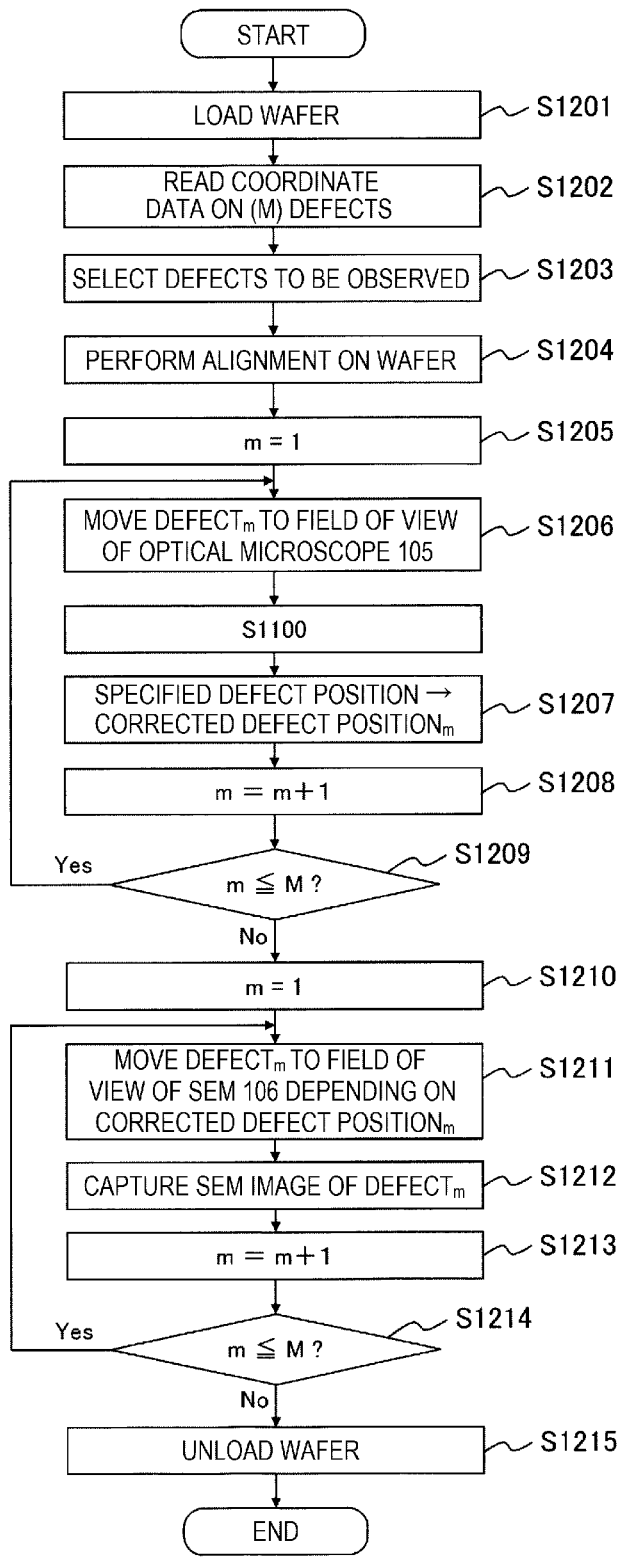

[FIG. 17]
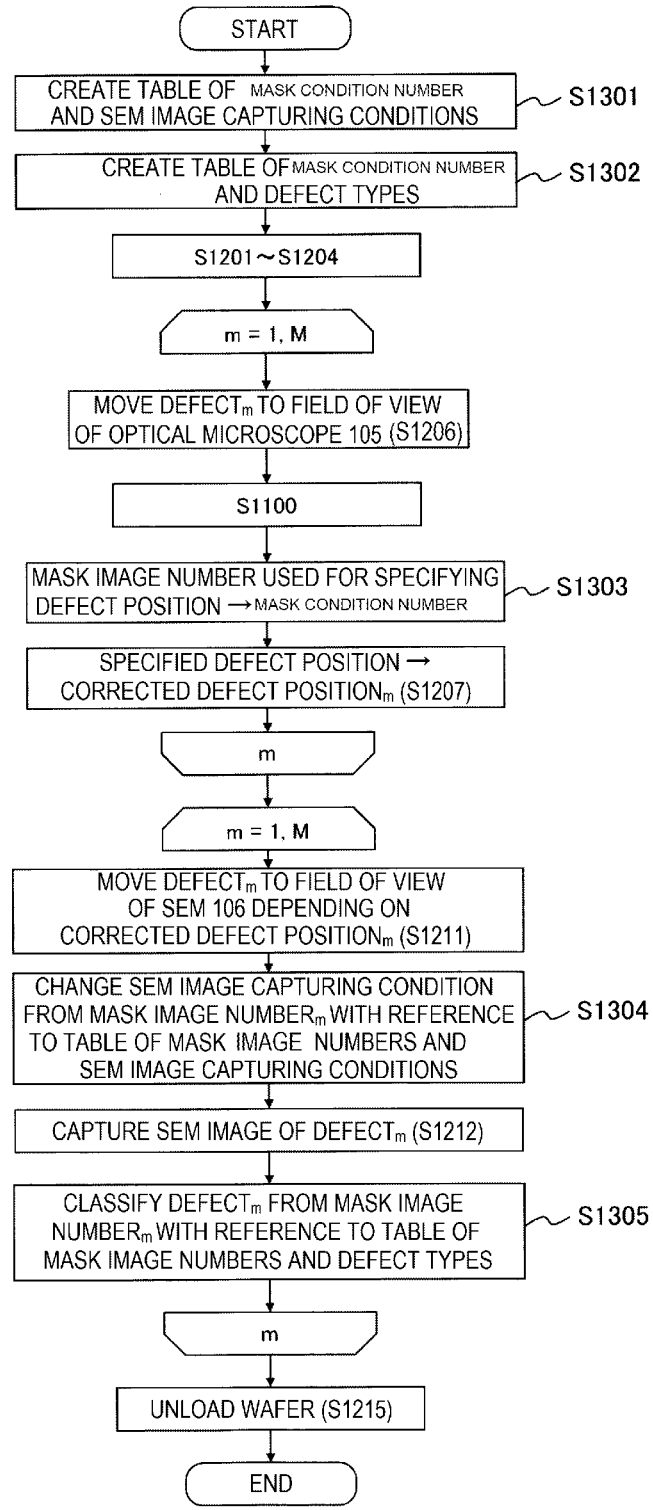

[FIG. 18]
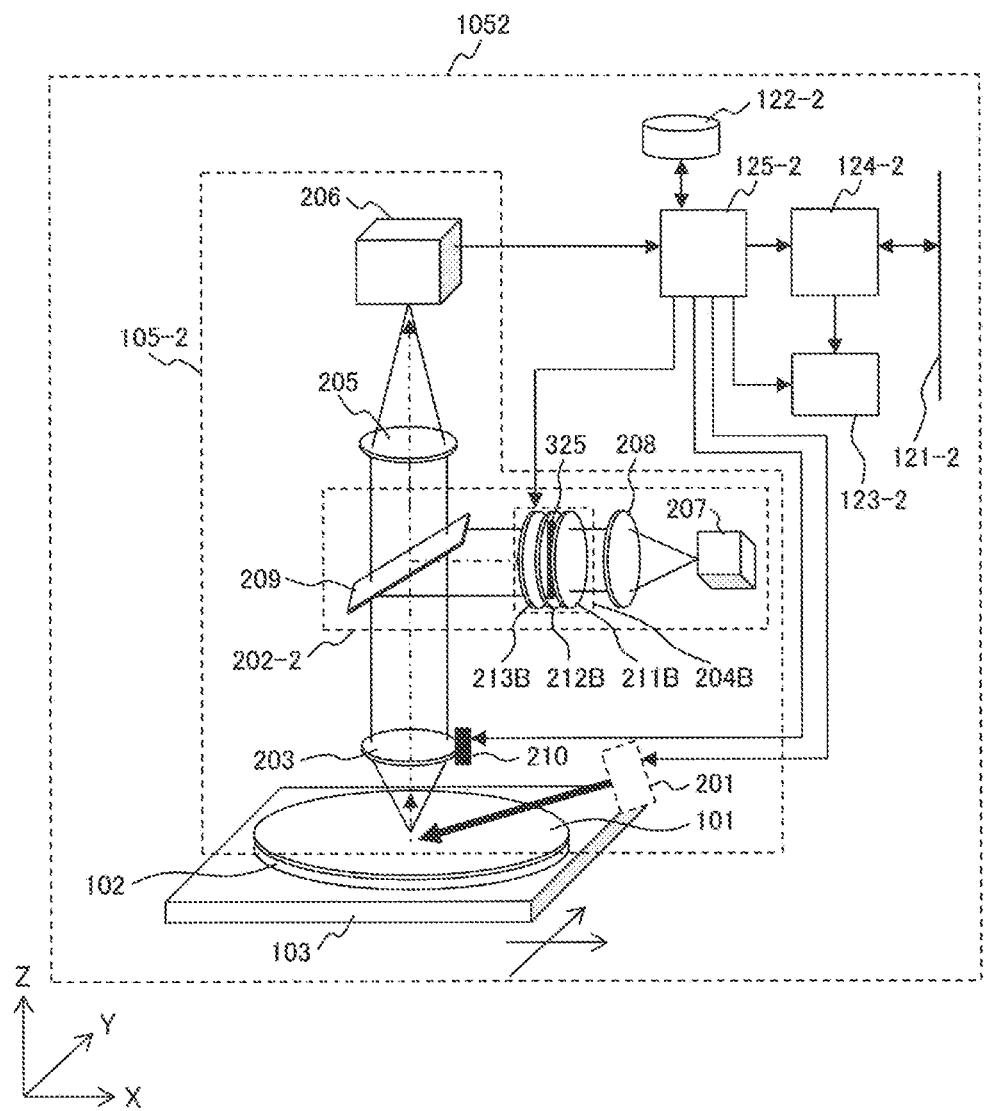

[FIG. 19]
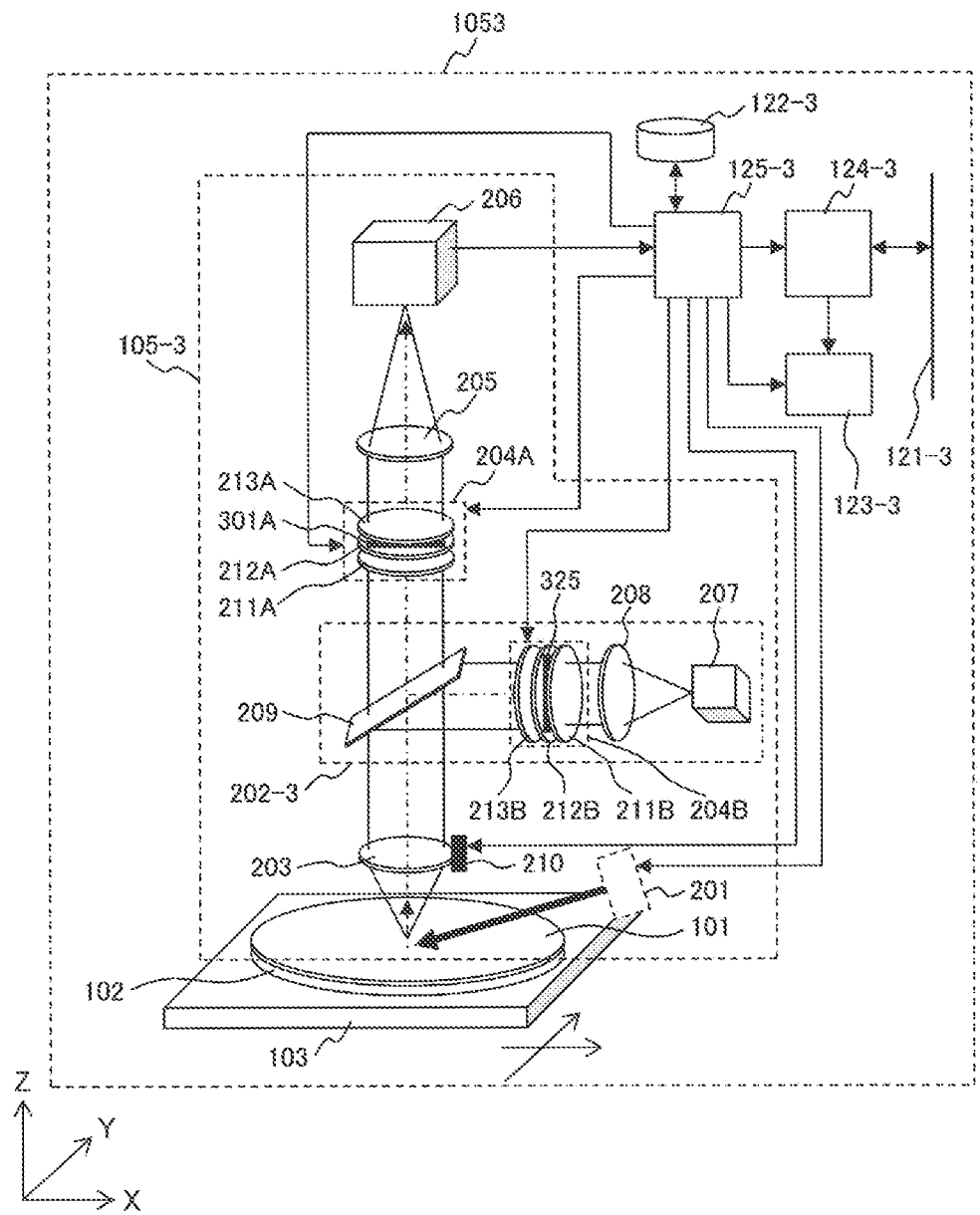

[FIG. 20]
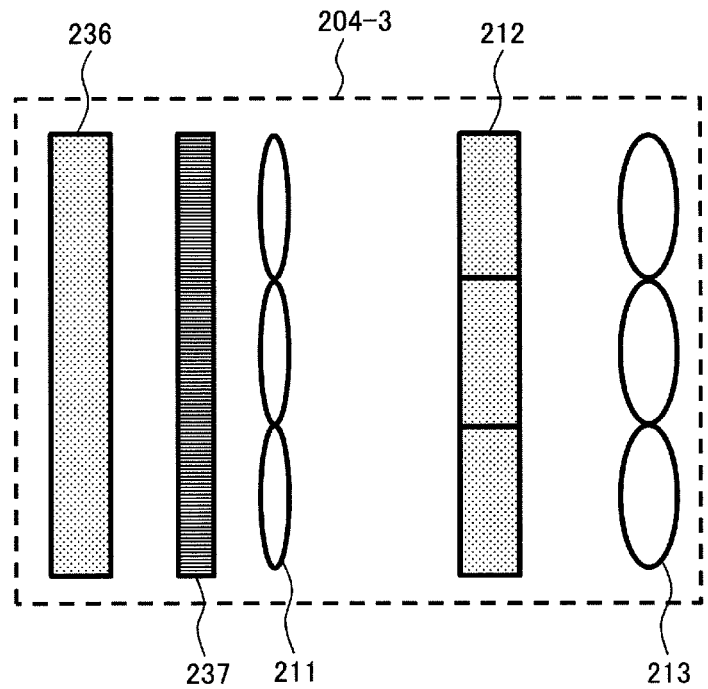
[FIG. 21]
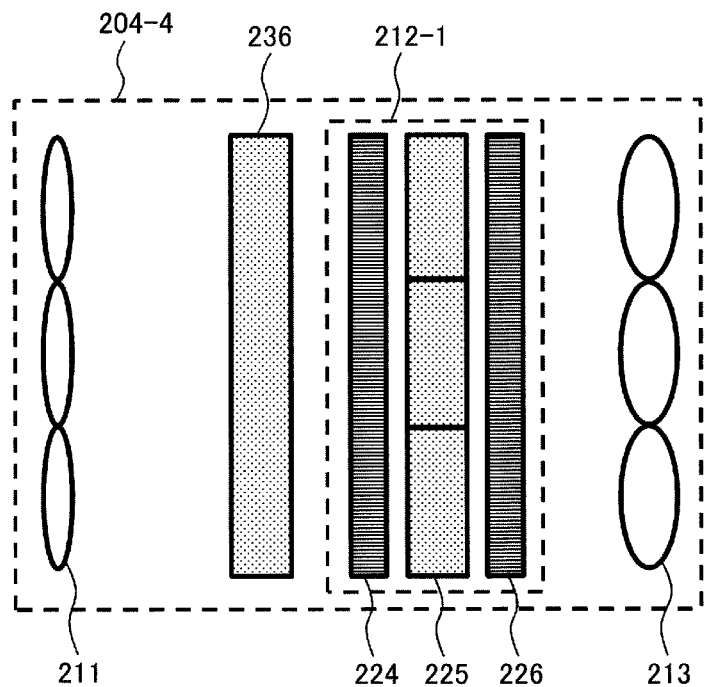

DEFECT DETECTION DEVICE, DEFECT DETECTION METHOD, AND DEFECT OBSERVATION APPARATUS INCLUDING DEFECT DETECTION DEVICE

TECHNICAL FIELD

The present invention relates to a defect detection device and a defect detection method for detecting a defect or the like generated on a semiconductor wafer in a manufacturing process of a semiconductor device, and a defect observation apparatus including the defect detection device.

BACKGROUND ART

Defect inspection of a foreign object defect, a pattern defect, or the like on a semiconductor wafer in a semiconductor manufacturing process is performed by defect detection and defect position calculation by a defect inspection apparatus and defect observation by a defect observation apparatus, and a process to be taken as a countermeasure is narrowed down based on an observation result of the defect. Since miniaturization of a semiconductor pattern progresses and a fine defect also affects a yield, a scanning electron microscope (SEM) is used for the observation apparatus.

The defect inspection apparatus and the SEM-type defect observation apparatus are separate apparatuses, and the defect observation apparatus observes a defect based on defect position information output from the defect inspection apparatus. However, the defect inspection apparatus and the defect observation apparatus are separate apparatuses, and it is difficult to position a defect in a field of view of the SEM-type defect observation apparatus only based on the defect position information calculated by the defect inspection apparatus due to deviation of stage coordinates between the apparatuses, or the like. As a method for solving this problem, PTL 1 discloses a method of, when defect observation is performed by the SEM, detecting a position of a defect using an optical microscope mounted on an observation apparatus and capturing an observation image of the SEM using detected position coordinates. PTL 1 also discloses a method of detecting a defect with high sensitivity by providing a filter on an optical path of the optical microscope.

As a method of detecting a defect with high sensitivity in a defect inspection apparatus, PTL 2 discloses a method of detecting a defect position on a wafer after a spatial filter is provided on a detection optical path of an optical microscope. PTL 2 also discloses a method of mechanically switching spatial filters having different shapes in order to detect different types of defects.

On the other hand, PTLS 3 and 4 disclose a spatial filter switching method using a rotating disk and a method of providing a digital mirror device with a spatial filter function in order to perform switching of spatial filters at high speed.

CITATION LIST

Patent Literature

PTL 1: JP-A-2011-106974
PTL 2: JP-A-2012-127848
PTL 3: US Patent Application Publication 2014/0354983 specification
PTL 4: U.S. Pat. No. 5,867,736 specification

SUMMARY OF INVENTION

Technical Problem

It is desired that the defect detection in the defect inspection apparatus and the SEM-type defect observation apparatus can be executed with high sensitivity and high throughput for all defect types.

PTLS 1 to 3 disclose a dark-field optical microscope having a function of mechanically switching the spatial filters disposed on a pupil plane (Fourier transform plane of an object plane) of the detection optical path. However, in this method, a large number of filters may be mounted in advance in order to attain high versatility, a mechanism that selects a required filter from the large number of filters and disposes the filter on an optical path may be increased in size, and a switching time may be increased.

PTL 4 discloses a method of using an open and close MEMS shutter array as a method for switching the spatial filters at high speed. However, an aperture ratio may be low due to a region other than a shutter open and close portion, which is necessary for a configuration of the open and close MEMS shutter array.

An object of the invention is to provide a defect detection device and a method capable of detecting a defect present on a semiconductor wafer with high sensitivity and at high speed regardless of a type of the defect and calculating a defect position, and a defect observation apparatus using the defect detection device.

Solution to Problem

In order to solve the problems described above, the invention provides a defect detection device including an illumination optical system configured to irradiate a wafer with light, an image capturing optical system configured to capture an image of scattered light generated on the wafer irradiated with light by the illumination optical system, and an image processing unit configured to process a picture of the image of the scattered light obtained by capturing by the image capturing optical system to extract a defect on the wafer. The imaging optical system includes an objective lens, a filter unit configured to shield a part of light transmitted through the objective lens, and an imaging lens configured to form an image of light transmitted through the filter unit on an image capturing device. The filter unit includes a first microlens array configured to condense parallel light transmitted through the objective lens, a shutter array including a light transmission unit at a focus position of the first microlens array, and a second microlens array disposed on a side opposite to the first microlens array with respect to the shutter array.

In order to solve the problems described above, the invention provides a defect detection method including irradiating a wafer with light by an illumination optical system, capturing, by an image capturing optical system, an image of scattered light generated on the wafer irradiated with light by the illumination optical system, and processing, with an image processing unit, a picture of the image of the scattered light obtained by capturing by the image capturing optical system to extract a defect on the wafer. The imaging optical system capturing the image of the scattered light is executed by causing light transmitted through an objective lens of the image capturing optical system to be incident on a filter unit and forming an image of light transmitted through the filter unit on an image capturing device by an imaging lens. The light transmitted through the filter unit is light that parallel light transmitted through the objective lens is condensed by a first microlens array, and in the light condensed by the first microlens array, the light transmitted through a shutter array including a light transmission unit at a focus position of the first microlens array and is made into parallel light by a second microlens array.

In order to solve the problems described above, the invention provides a defect observation apparatus including an optical microscope unit, a scanning electron microscope unit, a stage unit on which a sample is placed and which is configured to move between the optical microscope unit and the scanning electron microscope unit, and a control system unit configured to control the optical microscope unit, the scanning electron microscope unit, and the stage unit. The optical microscope unit includes an illumination optical system configured to irradiate the wafer with light, an image capturing optical system configured to capture an image of scattered light generated on the wafer irradiated with light by the illumination optical system, and an image processing unit configured to process a picture of the image of the scattered light obtained by capturing by the image capturing optical system to extract a defect on the wafer. The imaging optical system includes an objective lens, a filter unit configured to shield a part of light transmitted through the objective lens, and an imaging lens configured to form an image of light transmitted through the filter unit on an image capturing device. The filter unit includes a first microlens array configured to condense parallel light transmitted through the objective lens, a shutter array including a light transmission unit at a focus position of the first microlens array, and a second microlens array disposed on aside opposite to the first microlens array with respect to the shutter array.

Advantageous Effect

According to the invention, highly sensitive and high-speed detection of various types of defects is achieved. A large number of spatial filters and the mechanism that mechanically switches the spatial filters as in the related art are not required, so that a size of the optical microscope unit can be reduced. In addition, by disposing the shutter array among the plurality of microlens arrays, an aperture ratio of the detection optical system can be increased.

BRIEF DESCRIPTION OF DRAWINGS

FIG. 1 is a block diagram showing a schematic configuration of a defect detection device according to a first embodiment of the invention.

FIG. 2 is a block diagram showing a configuration of a control unit of the defect detection device according to the first embodiment of the invention.

FIG. 3 is a table showing examples of light shielding regions of a multi-shutter device according to the first embodiment of the invention.

FIG. 4 is a side view of the multi-shutter device showing an example of a basic configuration of the multi-shutter device according to the first embodiment of the invention, and shows a case in which an optical axis of a microlens array and an optical axis of incident light coincide with each other.

FIG. 5 is a side view of the multi-shutter device showing the example of the basic configuration of the multi-shutter device according to the first embodiment of the invention, and shows a case in which the optical axis of incident light is inclined with respect to the optical axis of the microlens array.

FIG. 6 is a side view of the multi-shutter device showing the example of the configuration of the multi-shutter device according to the first embodiment of the invention, and shows a case in which all MEMS shutters are open in an example using a MEMS shutter array.

FIG. 7 is a side view of the multi-shutter device showing the example of the configuration of the multi-shutter device according to the first embodiment of the invention, and shows a case in which a part of the MEMS shutters are closed in the example using the MEMS shutter array.

FIG. 8 is a side view of the multi-shutter device showing the example of the configuration of the multi-shutter device according to the first embodiment of the invention, and shows a case in which all liquid crystal shutters transmit light in an example using a liquid crystal shutter array.

FIG. 9 is a side view of the multi-shutter device showing the example of the configuration of the multi-shutter device according to the first embodiment of the invention, and shows a case in which a part of the liquid crystal shutters blocks light in the example using the liquid crystal shutter array.

FIG. 10 is a front view of a screen showing an example of a GUI for setting a filter to be displayed on a user interface according to the first embodiment of the invention.

FIG. 11 is a block diagram showing a schematic configuration of a defect detection device according to a second embodiment of the invention.

FIG. 12 is a front view of a screen showing an example of a GUI for setting a filter to be displayed on a user interface according to the second embodiment of the invention.

FIG. 13 is a flowchart showing a defect detection processing flow according to the first and second embodiments of the invention.

FIG. 14 is a block diagram showing a schematic configuration of a defect observation apparatus according to a third embodiment of the invention.

FIG. 15 is a block diagram showing a configuration of a control unit of the defect observation apparatus according to the third embodiment of the invention.

FIG. 16 is a flowchart showing a defect observation processing flow according to the third embodiment of the invention.

FIG. 17 is a flowchart showing a processing flow of defect observation processing according to a fourth embodiment of the invention, and is a flowchart for performing processing of controlling SEM image capturing conditions and classifying defect images captured by a SEM using information on mask conditions used for the defect detection and information on evaluation values obtained based on an optical microscope image.

FIG. 18 is a block diagram showing a schematic configuration of a defect detection device according to a fifth embodiment of the invention.

FIG. 19 is a block diagram showing a schematic configuration of a defect detection device according to a sixth embodiment of the invention.

FIG. 20 is a side view of a multi-shutter device showing another configuration of the multi-shutter device according to a seventh embodiment of the invention.

FIG. 21 is a side view of a multi-shutter device showing a configuration of the multi-shutter device according to an eighth embodiment of the invention.

DESCRIPTION OF EMBODIMENTS

According to the invention, a spatial filter is formed using a multi-shutter device employing a shutter array, and by employing this spatial filter, it is possible to implement highly sensitive and high-speed detection of all types of defects.

According to the invention, by forming the spatial filter using the multi-shutter device employing the shutter array, a large number of spatial filters and a mechanism that mechanically switches the spatial filters as in related art are not required, so that a size of an optical microscope can be reduced.

Hereinafter, embodiments of the invention will be described in detail with reference to the drawings for an example of a defect inspection apparatus in which a spatial filter formed using a multi-shutter device employing a shutter array is applied to an optical microscope unit and an example of a defect observation apparatus. In all the drawings showing the present embodiment, components having the same function are denoted by the same reference numerals, and the repetitive description thereof will be omitted in principle.

However, the invention should not be construed as being limited to description of the embodiments described below. Those skilled in the art could have easily understood that specific configurations can be changed without departing from the spirit or gist of the invention.

First Embodiment

FIG. 1 shows an example of a configuration of a defect detection device according to a first embodiment of the invention. The defect detection device according to the present embodiment is a defect detection device that detects a defect on a wafer generated in a manufacturing process of a semiconductor device or a defect detection device mounted on a defect observation apparatus.

A reference numeral 1050 denotes the defect detection device. The defect detection device 1050 generally includes a sample holder 102, a stage 103, an optical microscope unit 105, a network 121, a database 122, a user interface 123, a storage device 124, and a control system unit 125.

A reference numeral 101 denotes the wafer which is a sample to be inspected. A reference numeral 102 denotes the sample holder on which the wafer 101 is placed. A reference numeral 103 denotes the stage on which the sample holder 102 can be placed, and which allows any position of the wafer 101 to be moved in a field of view of the optical microscope unit 105. A reference numeral 105 denotes the optical microscope unit that optically detects a defect on the wafer 101 and acquires defect position information of the defect.

The optical microscope unit 105 includes a laser illumination optical system 201 that irradiates the wafer 101 with light from an oblique direction, a vertical illumination optical system 202 that irradiates the wafer 101 with light from a vertical direction, a detection optical system 110, and a height control mechanism 210.

The laser illumination optical system 201 (hereinafter referred to as an oblique illumination optical system 201) includes a laser light source (not shown), a beam shaping lens group (not shown), and a plurality of mirrors (not shown) for controlling an optical path, as described as, for example, a dark-field illumination unit 101 in PTL 1.

The vertical illumination optical system 202 includes an illumination light source 207, a lens 208 that shapes light emitted from the illumination light source 207, and a half mirror 209 that reflects a part of the light transmitted through the lens 208 toward the wafer 101 serving as the sample. The light reflected by the half mirror 209 is condensed on the wafer 101 by an objective lens 203.

The detection optical system 110 includes the objective lens 203, a multi-shutter device 204, an imaging lens 205, a detector 206, and the height control mechanism 210. The objective lens 203 is a lens that collects light emitted from the oblique illumination optical system 201 or the vertical illumination optical system 202 and reflected and scattered by the wafer 101. The light collected by the objective lens 203 and transmitted through the multi-shutter device 204 is imaged on the detector 206 by the imaging lens 205 and is converted into an electric signal. The height control mechanism 210 adjusts a height of the objective lens 203, so that a focus of the objective lens 203 is on the wafer 101.

The multi-shutter device 204 includes two microlens arrays 211, 213 and a shutter array 212, and is a filter unit capable of electrically controlling and selecting a light shielding region. The multi-shutter device 204 is disposed on a pupil plane (Fourier transform plane of the wafer 101) 301 of the detection optical system 110 of the optical microscope unit 105 or on a plane conjugate with the pupil plane 301. The microlens arrays 211, 213 are lens units in which lenses are arranged in a grid pattern. The shutter array 212 is a shutter unit in which shutters capable of electrically switching light shielding or transmission are disposed in a grid pattern.

As shown in FIG. 2, the control system unit 125 includes a stage control circuit 1251, an illumination control circuit 1252, an objective lens height control circuit 1253, a multi-shutter device control circuit 1254, an image processing circuit 1255, an external input and output I/F 1256, a CPU 1257, and a memory 1258. In the control system unit 125, each component is connected to a bus 1259, and information can be received and output from and to one another.

The stage control circuit 1251 controls the stage 103, the illumination control circuit 1252 controls the oblique illumination optical system 201 and the vertical illumination optical system 202, the objective lens height control circuit 1253 controls the height control mechanism 210 of the objective lens 203, and the multi-shutter device control circuit 1254 controls the multi-shutter device 204.

The image processing circuit 1255 executes arithmetic processing on image data obtained from the detector 206 of the optical microscope unit 105, detects a defect in a captured image, and calculates a defect position. The external input and output I/F 1256 outputs display information to the user interface 123, receives information from the user interface 123, receives and outputs information from and to the storage device 124, and receives and outputs information from and to an external device, a high order management system, or the like via the network 121. Image data stored in the memory 1258 is subjected to the arithmetic processing by the CPU 1257.

FIG. 3 shows examples of the light shielding region of the multi-shutter device 204 according to the present embodiment in a table form. In (a) to (h) of FIG. 3, a reference numeral 303 denotes an incident azimuth angle of the oblique illumination optical system 201. A reference numeral 304 denotes a regular reflection azimuth angle of the oblique illumination optical system 201. A reference numeral 302 denotes an incident surface of the oblique illumination optical system 201. Reference numerals 305 to 312 in (a) to (h) show outer peripheries of pupil regions on the pupil plane 301 of the objective lens 203 or on the plane conjugate with the pupil plane 301, and blackened boundary regions in the outer peripheries indicate the light shielding regions (hereinafter, referred to as a mask shape) of the multi-shutter device 204 according to the present embodiment.

For example, a mask shape 3051 that reduces detection NA in the pupil region 305 in (a) has effects of improving contrast and increasing a depth of focus. A mask shape 3061 in the pupil region 306 in (b) has effects of removing scattered light that is strongly scattered in a direction returning to an incident direction of a laser (hereinafter, referred to as backward scattering) and that is caused by unevenness of a surface of the wafer 101, and improving sensitivity of a minute defect.

Mask shapes 3071 and 3081 in the pupil regions 307 and 308 in (c) and (d) have effects of selectively transmitting light scattered to a region where a ratio of a scattered light amount from a defect to the scattered light caused by the unevenness of the surface of the wafer 101 is large, and improving the sensitivity of a minute defect. For example, the mask shape 3071 in the pupil region 307 in (c) has an effect of improving detection sensitivity of a part of a PID defect having a low stepped difference, and the mask shape 3081 in the pupil region 308 in (d) has an effect of improving detection sensitivity of a minute foreign object.

A mask shape 3091 in the pupil region 309 in (e) is a mask that only transmits a high-NA region. For example, when the wafer 101 is illuminated using the oblique illumination optical system 201, a large amount of scattered light that is strongly scattered from the minute foreign object can transmit the high-NA region. When the wafer 101 is illuminated using the vertical illumination optical system 202, only a high spatial frequency component can be selectively transmitted.

A mask shape 3101 in the pupil region 310 in (f) can selectively transmit only high spatial frequency components in an X direction (shown in FIG. 1), and a mask shape 3111 in the pupil region 311 in (g) can selectively transmit only high spatial frequency components in a Y direction (shown in FIG. 1). A mask shape 3121 in the pupil region 312 in (h) can shield specific spatial frequency components in each of the X direction and the Y direction. For example, the mask shape 3121 can be used when a periodic repetitive pattern is present on the wafer 101 and scattered light from the pattern is desired to be removed.

Spatial distributions of the scattered light from the defect, the scattered light from the wafer, and pattern diffracted light on the pupil plane depend on an incident direction (incident angle and incident azimuth angle) of the illumination and an illumination wavelength. Therefore, by selecting the mask shape in accordance with an illumination condition, detection sensitivity of a defect to be detected can be improved. For example, different mask shapes are used for the oblique illumination optical system 201 and the vertical illumination optical system 202.

FIGS. 4 and 5 show an example of a basic configuration of the multi-shutter device 204 according to the present embodiment. The multi-shutter device 204 is disposed on the Fourier transform plane of the detection optical system of the optical microscope unit 105 or on the plane conjugate with the Fourier transform plane. A relay lens can be used for creating the plane conjugate with the Fourier transform plane.

For example, when the Fourier transform plane is present inside a lens barrel of the objective lens 203 and it is difficult to dispose a filter, the relay lens is used to project the Fourier transform plane outside the lens barrel, and the multi-shutter device 204 can be disposed on a projected plane (=conjugate plane).

A diameter of the Fourier transform plane of the objective lens 203 is limited by a numerical aperture (=aperture NA). Therefore, by performing enlarged projection using the relay lens, a diameter of the plane conjugate with the Fourier transform plane can be enlarged, a size of each element constituting the multi-shutter device 204 can be increased, and mounting can be facilitated. By performing the enlarged projection of the Fourier transform plane, it is possible to reduce an influence on a boundary region between lenses of the microlens array 211.

As shown in FIGS. 4 and 5, the multi-shutter device 204 is formed such that the shutter array 212 is sandwiched between at least two microlens arrays 211, 213. A microlens 215 is one lens constituting the microlens array 211, and a microlens 216 is one lens constituting the microlens array 213. A shutter 217 is one component constituting the shutter array 212, and can be electrically controlled, so that each shutter can be switched between an opening state 218 and a light shielding state 219.

FIG. 4 shows paths of light from a center of an optical axis. Light 313 scattered from the wafer 101 at a center of the field of view of the optical microscope unit 105 becomes parallel light by the objective lens 203, is perpendicularly incident on the microlens 215 constituting the microlens array 211, is focused on a vicinity of a center of an opening portion of the shutter 217 once the shutter 217 is in the opening state 218, then becomes the parallel light again by the microlens 216 constituting the microlens array 213 while spreading, and is condensed on the detector 206 by the imaging lens 205 in FIG. 1.

On the other hand, the light condensed on the shutter 217 in the light shielding state 219 is shielded by the shutter 217. The shutter array 212 is disposed at focus positions of the microlens arrays 211, 213, and the light transmitted through the microlens array 211 is focused on the vicinity of the center of the opening portion of the shutter 217. With this configuration, by adjusting a position of narrowed light and an opening position of the shutter array 212, even when an opening ratio of the shutter array 212 itself is low, a high opening ratio can be attained in the multi-shutter device 204.

FIG. 5 shows paths of light from an end of the field of view. Paths of light deviated from the center of the field of view of the optical microscope unit 105 are shown. Light 314 scattered from the wafer 101 becomes parallel light by the objective lens 203, is incident on the microlens 215 constituting the microlens array 211 of the multi-shutter device 204 at an angle, and is condensed on the shutter 217. At this time, when the shutter 217 is in the open state 218, the light 314 passes through the shutter 217, is incident on the microlens 216 constituting the microlens array 213, becomes the parallel light again, and is condensed on the detector 206 by the imaging lens 205. At this time, in order for the light 314 transmitted through a certain microlens 215 on a microlens array 211 side to be incident on the microlens 216 on a microlens array 213 side that is paired with the transmitted microlens 215, a reduction projection optical system is required to be formed, and a focus length f1 of the microlens 215 and a focus length f2 of the microlens 216 are required to satisfy f1 f2.

As shown in FIGS. 4 and 5, each pupil image is inverted after passing through the multi-shutter device 204 including two microlens arrays 211, 213 and the shutter array 212. When the number of divisions of the pupil image is sufficiently large, there is no influence of the divisions, reduction projection, and inversion of the pupil image on an image capturing field of view and the detector 206. When the inversion becomes a problem, a method of adding a pair of microlens arrays and returning to an upright state is considered.

A maximum projection magnification of the pupil image formed by the relay lens pair is limited by a size of the image capturing field of view. In a case in which a reduction ratio caused by the pair of microlens arrays 211, 213 is small in a wide field of view and a pattern due to a structural period of the microlens arrays 211, 213 is generated at the time of imaging, the pattern due to the periodic structure of the microlens arrays can be removed by adding the pair of microlens arrays. In these cases, the multi-shutter device 204 includes at least two or more microlens arrays and a shutter array.

A transmission and light shielding distribution (hereinafter, referred to as a mask shape) of the multi-shutter device 204 is set and selected by a recipe through the user interface 123, and is stored in the storage device 124 via the control system unit 125. In the recipe, a mask shape to be used may be selected from mask shapes stored in advance, or a mask shape may be designed on a GUI displayed on a screen of the user interface 123. As for the mask shape, by selecting a type of the wafer 101, a shape of the wafer 101, and a defect to be detected (hereinafter, referred to as an observation target condition), a mask shape associated with the observation target conditions in advance may be automatically selected.

FIGS. 6 and 7 show a first configuration example of the multi-shutter device 204 shown in FIGS. 4 and 5. Similar to the multi-shutter device 204 shown in FIGS. 4 and 5, a multi-shutter device 204-1 shown in FIGS. 6 and 7 has a configuration in which microlens arrays 211-1 and 213-1 are disposed on both sides of a shutter array 220.

A MEMS shutter array 220 is used as the shutter array 220. As the MEMS shutter array 220, a shutter array as described in PTL 3 may be used. The MEMS shutter array 220 implements light shielding and transmission by electrically driving light shielding plates 221 covering opening portions 222 and switching between an opening state (state of 222) in which the opening portion 222 is opened and a light shielding state (state of 223) in which the opening portion 222 is closed. Since the MEMS shutter array 220 switches between light shielding and transmission depending on presence or absence of a light shielding plate on an optical path, the MEMS shutter array 220 can be used regardless of a wavelength of transmitted light, that is, a wavelength of illumination.

FIGS. 8 and 9 show a second configuration example of the multi-shutter device 204 shown in FIGS. 4 and 5. In a multi-shutter device 204-2 shown in FIGS. 8 and 9, a liquid crystal shutter array 212 is used as the shutter array 212 corresponding to the shutter array 212 described with reference to FIGS. 4 and 5. The liquid crystal shutter array 212 includes two polarizing plates 224, 226 having the same transmission polarization axis, and liquid crystals 225 disposed between the polarizing plates 224 and 226. The liquid crystal 225 includes a plurality of divided liquid crystal cells, and can electrically control light shielding and transmission for each cell.

As shown in FIG. 8, light transmitting through the polarizing plate 224 transmits through liquid crystal cells 227 of which a voltage is off while maintaining polarization, and is transmitted through the polarizing plate 226. In FIG. 8, a reference numeral 229 schematically shows a state in which the light transmits from the liquid crystal cells 227. On the other hand, as shown in FIG. 9, in liquid crystal cells 228 of which a voltage is on, a polarization direction of the transmitted light is rotated by 90°. Therefore, the light is shielded by the polarizing plate 226. In FIG. 9, a reference numeral 230 schematically shows a state in which the light is shielded by the liquid crystal cells 228.

FIGS. 8 and 9 show a configuration in which light is shielded when a voltage is applied. However, by setting the transmission polarization axis of the polarizing plate 226 to a direction rotated by 90°, the light can be transmitted when the voltage is applied, and the light can be shielded when the voltage is off.

The number of each element shown in FIGS. 4 to 9 is 3, 4, or 5 for simplification. However, the number of each element is actually 10×10 or more, and the number of each element is not limited to the number shown in the drawings.

FIG. 10 shows an example of a GUI for setting a filter to be displayed on the user interface 123 according to the present embodiment. In FIG. 10, a reference numeral 315 denotes a filter setting GUI. The GUI 315 shows a case in which a mask shape is associated with observation target conditions in advance. By selecting the observation target conditions on the GUI, the mask shape that is associated with observation target conditions in advance is selected and set. In the GUI 315, a filter valid and invalid 316 and a sample condition 317 are shown as the observation target conditions to be set.

A tab 318 indicates an example of a setting condition when the wafer 101 is a wafer without a pattern. In the tab 318, it is possible to select and set a surface condition (including presence or absence of a film) of a substrate, a material and thickness of a film when the film is present, an optical condition of the optical microscope unit 105, and a defect type desired to be detected. The preset mask shape can be empirically determined based on an optical calculation, a scattering simulation, or an experiment.

The setting conditions shown in FIG. 10 is an example, and is not limited to the condition shown in FIG. 10. For example, when the wafer 101 is a wafer having a pattern, it is conceivable to input a pitch, a material, and the like of the pattern on the wafer 101.

As described above, the multi-shutter device according to the present embodiment includes a first microlens array that condenses parallel light, a second microlens array that converts the light condensed by the first microlens array and spread into the parallel light, and a shutter array disposed at focus positions of the first microlens array and the second microlens array between the first microlens array and the second microlens array. The shutter array can individually and electrically switch each shutter constituting the shutter array between light shielding and transmission, and when a focus length of a lens constituting the first microlens array is f1 and a focus length of a lens constituting the second microlens array is f2, $f1 \geq f2$.

According to the present embodiment, the large number of spatial filters and the mechanism that mechanically switches the spatial filters as in the related art are not required, so that a size of the optical microscope unit 105 can be reduced. By disposing the shutter array 212 between the plurality of microlens arrays 211, 213, an aperture ratio of the detection optical system can be increased. Further, since the shutter array 212 is controlled based on a plurality of pieces of spatial filter information generated and stored in advance for each defect type, for each defect shape, or for each wafer type, more types of defects and finer defects can be detected with high sensitivity as compared with a case in which the multi-shutter device 204 as in the present embodiment is not used.

Second Embodiment

FIG. 11 shows an example of a configuration of a defect detection device 1051 according to a second embodiment of the invention. In the present embodiment, a Fourier transform plane observation system 235 that observes a Fourier transform plane 301 which is a pupil plane of the objective lens 203 is mounted, and it is possible to observe a Fourier transform plane to be observed. A basic configuration of the defect detection device 1051 is substantially the same as the configuration of the defect detection device 1050 described with reference to FIG. 1 in the first embodiment, and the same components are denoted by the same reference numerals. In order to avoid redundant description, only differences from the defect detection device 1050 described with reference to FIG. 1 will be described below.

An optical microscope unit 105-1 of the defect detection device 1051 according to the present embodiment includes the Fourier transform plane observation system 235, and is connected to a network 121-1, a database 122-1, a user interface 123-1, a storage device 124-1, and a control system unit 125-1. The Fourier transform plane observation system 235 includes a half mirror 231, relay lenses 232, 233, and an image capturing device 234.

Reflected light or scattered light generated from the wafer 101, which is the sample illuminated by the oblique illumination optical system 201 or the vertical illumination optical system 202 of the optical microscope unit 105-1 is made into parallel light by the objective lens 203, is transmitted through the multi-shutter device 204, and then is incident on the half mirror 231 of the Fourier transform plane observation system 235. A part of the light incident on the half mirror 231 is transmitted through the half mirror 231, is incident on the imaging lens 205, and is condensed on the detector 206. On the other hand, a part of the light incident on the half mirror 231 is reflected by the half mirror 231 and is incident on the relay lens 232.

The relay lenses 232, 233 are formed such that a plane conjugate with the Fourier transform plane of the objective lens 203 is projected onto the image capturing device 234. The reflected light or scattered light generated from the wafer 101 incident on the relay lens 232 formed as described above is projected onto the image capturing device 234, and the image capturing device 234 converts the projected image of the plane conjugate with the Fourier transform plane into an electric signal.

The plane conjugate with the Fourier transform plane converted into the electric signal by the image capturing device 234 is processed by the control system unit 125-1. By displaying the image of the plane conjugate with the Fourier transform plane that is acquired by the image capturing device 234 on the user interface 123-1, a user can design the mask shape by himself or herself based on a Fourier transform plane image of an actual observation target.

The Fourier transform plane observation system 235 may use a mirror that can be taken in and out from the optical axis instead of the half mirror 231. In this case, the mirror is disposed on the optical axis, the Fourier transform plane is observed by the imaging element 234, the mask shapes as described with reference to FIG. 3 are designed and set, and after the mask setting is finished, the mirror is removed from the optical axis and defect detection is performed. Accordingly, a decrease in a light amount at the time of the defect detection can be prevented.

FIG. 12 shows an example of a GUI for setting a filter to be displayed on a screen of the user interface 123 according to the present embodiment. In FIG. 12, a reference numeral 319 denotes a filter setting GUI. The GUI 319 includes a selection of a filter valid and invalid 316, a filter tab 320, and a filter design tab 321. By selecting the filter tab 320, mask shapes of a plurality of filters can be individually set.

A Fourier transform plane image 322 acquired by the Fourier transform plane observation system 235 is displayed on the filter design tab 321. By selecting a light shielding and opening region on a filter shape image 323 using an arrow 324, the user can design the mask shapes as described with reference to FIG. 3 based on the Fourier transform plane image of the actual observation target.

According to the present embodiment, since the filter can be set while the Fourier transform plane is observed, all types of defects can be detected with high sensitivity.

FIG. 13 shows a defect detection processing flow S1100 as an example of defect detection processing according to the first and second embodiments of the invention.

First, R types of conditions (hereinafter, referred to as mask conditions) of the multi-shutter devices 204 that are to be used are prepared (S1101). Each mask condition is expressed as a mask (r). The mask conditions are set in advance by the user using the GUI as shown in FIG. 10 or FIG. 12.

Next, the control system unit 125 sets transmission and light shielding conditions of the shutter array 212 in the multi-shutter device 204 to the mask (r) (S1102).

Next, an optical microscope image (r) is acquired through the multi-shutter device 204 of the mask (r) (S1103), and an evaluation value (r) and a threshold value (r) are calculated based on the acquired optical microscope image (r) (S1104). For example, the evaluation value (r) includes a maximum luminance value in the optical microscope image (r), an area of a maximum luminance value region, the number of regions having a threshold value equal to or greater than the threshold value (r), a maximum area of the region having a threshold value equal to or greater than the threshold value (r), and the like. The evaluation value (r) is not limited thereto, and includes a value obtained by combining the evaluation values and a value obtained based on the optical microscope image (r) or an image (r) obtained by processing the optical microscope image (r).

Steps S1102 to S1104 are processing for the mask (r), and are repeated under the R mask conditions set in S1101 in advance (S1105, S1106—YES). When the acquisition of the optical microscope image is completed under the R mask conditions set in advance in S1101 (S1106—No), based on the acquired R evaluation values, a maximum evaluation value (maxval) and a mask image number max_r at the maximum evaluation value are obtained (S1108 to S1111).

When the maximum evaluation value (maxval) is equal to or greater than a threshold value th for ensuring reliability set in advance (S1112—YES), defect coordinates (max_r) obtained based on the optical microscope image (max_r) is output as defect coordinates (S1113), and the defect detection is ended.

In S1112, when the maxval is equal to or less than the threshold value th for ensuring the reliability (S1112—No), it is determined as "no defect", and the defect detection is ended. The defect detection device 1050 outputs the calculated defect coordinates.

By performing the processing according to the flow as described above, by comparing the mask image number max_r for detecting a defect position or the evaluation values (r) in the plurality of optical microscope images (r), it is possible to classify and specify corresponding properties of the defect, for example, properties such as unevenness, a type of the defect, and a shape (including a size and a direction) of the defect. At this time, the defect detection device 1050 outputs not only the defect coordinates but also classified or specified defect information.

According to the present embodiment, in addition to the effects described according to the first embodiment, the Fourier transform plane of the observation target can be observed. Accordingly, the multi-shutter array can be controlled according to a state of the observed Fourier transform plane, and thus it is possible to reliably detect the type of defect desired to be detected.

Third Embodiment

FIG. 14 shows an example of a configuration of a defect observation apparatus 1000 according to a third embodiment of the invention. The defect observation apparatus 1000 according to the present embodiment has a configuration using the defect detection device 1050 described according to the above-described first embodiment, and may have a configuration using the defect detection device 1051 described according to the second embodiment.

The defect observation apparatus 1000 schematically includes an observation device 100, a network 1210, a database 1220, a user interface 1230, a storage device 1240, and a control system unit 1250. The defect observation apparatus 1000 is connected to a defect inspection apparatus 107, which is another inspection apparatus, via the network 1210.

The defect inspection apparatus 107 detects a defect present on the wafer 101 and acquires defect information such as position coordinates and a size of the defect.

The defect information acquired by the defect inspection apparatus 107 is input to the storage device 1240 or the control system unit 1250 via the network 1210. The storage device 1240 stores the defect information that is input via the network 1210 and that is acquired by the defect inspection apparatus 107. The control system unit 1250 reads the defect information output from the defect inspection apparatus 107 or the defect information stored in the storage device 1240, and controls the observation device 100 based on the read defect information. Then, some or all the defects detected by the defect inspection apparatus 107 are observed in detail, and classification of the defects, analysis of a cause of occurrence, and the like are executed.

The observation device 100 includes, for example, a driving unit including the sample holder 1020 and the stage 1030, an optical height detector 104, the optical microscope unit 105 described according to the first and second embodiments, a scanning electron microscope unit 106 (SEM unit), a vacuum chamber 109, and a laser displacement meter (not shown).

The wafer 101 is placed on a sample holder 1020 provided on a movable stage 1030. The stage 1030 moves the wafer 101 placed on the sample holder 1020 between the optical microscope unit 105 and the SEM unit 106. By the movement of the stage 1030, an observation target defect present on the wafer 101 can be moved into a field of view of the SEM unit 106 or the field of view of the optical microscope unit 105.

The optical height detector 104 measures a height position of a surface of an observation target region of the wafer 101. Height information of the wafer 101 measured by the optical height detector 104 is output to the control system unit 1250 and is fed back to a focus position adjustment operation sequence of the optical microscope unit 105 or the SEM unit 106.

The optical microscope unit 105 is an optical microscope unit that optically detects a defect on the wafer 101 and acquires the defect position information of the defect. Since details of the optical microscope unit 105 are described in the first and second embodiments, the description thereof will be omitted here.

The SEM unit 106 includes an electron beam irradiation system including an electron beam source 151, an extraction electrode 152, a condenser lens (SEM) 153, a deflection electrode 154, and an objective lens electrode (SEM) 155, and an electron detection system including a secondary electron detector 156 and a reflected electron detector 157. Primary electrons are emitted from the electron beam source 151 of the SEM unit 106, and the emitted primary electrons are extracted and accelerated onto a beam by the extraction electrode 152. The emitted primary electrons are further controlled in the X direction and the Y direction by the condenser lens (SEM) 153, the deflection electrode 154, and the objective lens electrode 155. The primary electron beam of which a trajectory is controlled by the objective lens electrode 155 converges on the surface of the wafer 101, and the surface of the wafer 101 is irradiated with the primary electron beam, so that the wafer 101 is scanned.

Secondary electrons, reflected electrons, and the like are generated from the surface of the wafer 101 irradiated and scanned with the primary electron beam. The generated secondary electrons are detected by the secondary electron detector 156. Electrons having relatively high energy such as the reflected electrons are detected by the reflected electron detector 157. A shutter (not shown) disposed on an optical axis of the SEM unit 106 selects a start and a stop of the irradiation of the wafer 101 with the electron beam emitted from the electron beam source 151. Measurement conditions of the SEM unit 106 are controlled by the control system unit 1250, so that an acceleration voltage, a focus and an observation magnification of the electron beam, the number of integrated frames, and the like can be changed.

The SEM unit 106 observes the defect in detail based on information obtained based on the image captured by the optical microscope unit 105. A general defect observation flow is disclosed in PTL 1.

The vacuum chamber 109 includes a vacuum sealing window 108 that transmits the illumination light emitted from the oblique illumination optical system 201 of the optical microscope unit 105 in atmosphere into the vacuum chamber 109, and a vacuum sealing window 1081 that allows the optical microscope unit 105 to detect the light reflected and scattered on the wafer 101.

The control system unit 1250 is connected to the stage 1030, the optical height detector 104, the optical microscope unit 105, the SEM unit 106, the user interface 1230, the database 1220, and the storage device 1240, and controls operations, input and output of each configuration such as the movement of the stage 1030, modulation of an illumination state of the optical microscope unit 105, the lens configuration, acquisition conditions of an image including ON and OFF of the multi-shutter device 204, acquisition and acquisition conditions of an image by the SEM unit 106, and measurement and measurement conditions of the optical height detector 104. The control system unit 1250 is connected to a high order system (for example, the defect inspection apparatus 107) via the network 1210.

As shown in FIG. 15, the control system unit 1250 includes a stage control circuit 12501, an illumination control circuit 12502, an objective lens height control circuit 12503 of the optical microscope unit 105 and the SEM unit 106, a multi-shutter device control circuit 12504, an image processing circuit 12505, an external input and output I/F 12506, a CPU 12507, and a memory 12508. In the control system unit 1250, each component is connected to a bus 12509, and information can be received and output from and to one another.

The stage control circuit 12501 controls the stage 1030, the illumination control circuit 12502 controls the oblique illumination optical system 201 and the vertical illumination optical system 202, the objective lens height control circuit 12503 controls the height control mechanism 210 of the optical microscope unit 105 and the objective lens electrode (SEM) 155 of the SEM unit 106, and the multi-shutter device control circuit 12504 controls the multi-shutter device 204.

The image processing circuit 12505 executes arithmetic processing on image data obtained from the detector 206 of the optical microscope unit 105, detects a defect in a captured image, and calculates a defect position. The external input and output I/F 12506 outputs display information to the user interface 1230, receives information from the user interface 1230, receives and outputs information from and to the storage device 1240, and receives and outputs information from and to an external device, a high order management system, or the like via the network 1210. Image data stored in the memory 12508 is subjected to the arithmetic processing by the CPU 12507.

FIG. 16 shows an example of defect observation processing according to the third embodiment. A procedure for collecting SEM images by the defect observation apparatus 1000 shown in FIG. 14 will be described with reference to the optical microscope unit 105 described with reference to FIG. 1 and the defect observation apparatus 1000 described with reference to FIG. 14.

First, the wafer 101 to be observed is loaded onto the stage 1030 (S1201). Next, defect coordinate data of defects detected in advance by another defect inspection apparatus 107 is read into the memory 12508 via the external input and output I/F 12506 of the control system unit 1250 (S1202), and M defects to be observed are selected from the defect coordinate data (S1203). The selection of the defects may be executed by the CPU 12507 using a preset program, or may be executed by an operator via the user interface 1230.

Next, alignment of the wafer 101 is executed (S1204). The alignment of the wafer 101 is that when the stage 1030 is moved based on a position of defect coordinates described by coordinates on the wafer 101, in order to make a position of target defect coordinates come near a center of the field of view of the SEM unit 106 and the field of view of the optical microscope unit 105, the wafer coordinates and stage coordinates are associated with each other using a positioning mark (alignment mark) of which coordinates on the wafer 101 are known or a wafer outer shape. A result of this association is stored in the memory 12508 as alignment information.

Next, defect positions of the M defects selected as the observation targets are corrected. First, a defect m is moved to the field of view of the optical microscope unit 105 (S1206). This movement is performed by the CPU 12507 calculating the stage coordinates corresponding to the defect m based on the defect coordinate data stored in the memory 12508 and the alignment information, and thereby driving the stage 1030 via the stage control circuit 12501.

After the movement of the stage 1030 is completed, a position of the defect m is specified in the processing S1100 described with reference to FIG. 13 (S1100), and the specified position of the defect is stored in the memory 12508 as a corrected defect position m (S1207). The above processing of S1206, S1100, S1207 is performed on the defect m (m=1, . . . , M).

Depending on the defect inspection apparatus 107, there is an apparatus that outputs not only the detected defect position coordinates but also information on a feature of the defect. For example, when it is known in advance whether the defect is convex or concave based on the defect feature information, the mask conditions to be used may be changed for each defect accordingly.

In order to implement the above, information for specifying the mask conditions to be used corresponding to the defect feature information is stored in the memory 12508 as a table in advance. Then, when the defect coordinate data of the defect detected by the above-described defect inspection apparatus 107 is read into the memory 12508, the defect feature information is also read in advance. When the CPU 12507 reads the defect information for each defect, the mask condition specifying information to be used may be read with reference to the table information stored in the memory 12508, and the mask image to be used when the processing S1100 is executed may be read from the database 1220.

After the corrected defect positions m of all the defects m (m=1, . . . , M) are acquired, the corrected defect position m is read from the memory 12508, and the position information is converted into the stage coordinates as necessary. Then, the stage control circuit 12501 is provided with the stage coordinates, thereby sequentially moving the defect m to the field of view of the SEM unit 106 (S1211) and capturing an SEM image of the defect m (S1212, S1213, and S1214). After the SEM images of all the defects are captured (NO in S1214), the wafer 101 is unloaded (S1215), and the processing is ended.

An optimum mask condition is determined based on the type and the direction of the defect. According to the present embodiment, the type and the direction of the defect can be known before the SEM image capturing based on the mask conditions used for detecting the defect position. Accordingly, it is possible to set an optimal image capturing condition under which a defect can be easily seen, according to the type and the direction of the defect.

For example, in the generation of the SEM observation image, for example, when the observation image is generated using the secondary electron image and the reflected electron image that are detected by the SEM so that the defect is visualized in the observation image of the SEM using the information of the defect, it is possible to change the image capturing condition such as a mixing ratio (for example, a ratio of the secondary electron image is increased when it is desired to detect a foreign object with high sensitivity, and a ratio of the reflected electron image is increased when it is desired to detect a dent or a convex defect with high sensitivity) of each image for each defect.

Fourth Embodiment

FIG. 17 shows an example of defect observation processing according to a fourth embodiment of the invention. In the fourth embodiment, controlling the SEM image capturing conditions and classifying the defect images captured by the SEM are executed using information on mask conditions used for the defect detection and information on evaluation values obtained based on an optical microscope image. A configuration of the defect observation apparatus is the same as that of the defect observation apparatus 1000 described according to the third embodiment with reference to FIG. 14.

For the same steps as the processing steps described with reference to FIG. 16, the step numbers shown in FIG. 16 are described in the boxes of the steps. In order to make the flow diagram easier to be seen, notation of the loop is changed.

In the processing flow in FIG. 17, first, a table of a correspondence relationship between a mask condition number and the SEM image capturing condition is created using the user interface 1230 or an external input device (S1301), and is stored in the memory 12508. Similarly, a table of the mask condition numbers and the defect types is created (S1302) and stored in the memory 12508. Steps S1301 and S1302 are not necessarily performed for each wafer, and may be created for each product of a semiconductor device to be observed, for each manufacturing process, or for each condition in which the mask condition number and the SEM image capturing condition or the mask condition number and the defect type have a certain relationship.

In processing of S1201 to S1204 shown in FIG. 17, the wafer loading, the defect coordinate data reading, the observation target defect selection, and the wafer alignment are executed, and then in S1206, S1100, and S1207, the defect position is detected by the optical microscope unit 105 and the coordinates are corrected. At this time, the mask condition number used for specifying the defect position in S1303 is stored in the memory 12508 as a mask image number m.

After the coordinate correction of the defect position is completed, the SEM unit 106 captures a defect image in S1211 and S1212. When an image of each defect is captured, the SEM image capturing condition is changed via an SEM image capturing control circuit 119 with reference to the table of the mask condition numbers and the SEM image capturing conditions stored in the memory and the mask image number m corresponding to the captured defect (S1304). The change of the SEM image capturing conditions may be a change of an image mixing ratio when an observation image is generated from a plurality of captured images. With reference to the table of the mask condition numbers and the defect types stored in the memory and the mask image number m corresponding to the captured defect, classification information on the defect m is stored in the memory and is used as defect classification information (S1305). S1305 may be executed after S1100 of the defect position detection processing executed by the optical microscope.

In the above description, the SEM image capturing conditions are set using the mask conditions at the time of acquiring the optical microscope image used for the defect detection, but the conditions are not limited to the mask conditions used for the defect detection. For example, the defect classification and the defect information output from the defect detection device 1050 may be used.

According to the present embodiment, by mounting the optical microscope unit 105 or 105-1 described according to the first or second embodiment on the defect observation apparatus 1000, it is possible to detect a defect position with high sensitivity and at high speed for a plurality of types of defects detected by the other defect inspection apparatus 107.

Fifth Embodiment

FIG. 18 shows an example of a configuration of a defect detection device 1052 according to a fifth embodiment of the invention. In the present embodiment, a multi-shutter device 204B is disposed on a pupil plane (Fourier transform plane) 325 of the illumination light source 207 of a vertical illumination optical system 202-2. By a control system unit 125-2 controlling a transmission and light shielding unit of the multi-shutter device 204B, it is possible to control illumination NA, a size of an illumination spot, and the like.

A basic configuration of the defect detection device 1052 according to the present embodiment is substantially the same as the configuration of the defect detection device 1050 described with reference to FIG. 1 according to the first embodiment, and the same components are denoted by the same reference numerals. In order to avoid redundant description, only differences from the defect detection device 1050 described with reference to FIG. 1 will be described below.

An optical microscope unit 105-2 of the defect detection device 1052 according to the present embodiment includes a vertical illumination optical system 202-2 between the objective lens 203 and the imaging lens 205, and is connected to a network 121-2, a database 122-2, a user interface 123-2, a storage device 124-2, and a control system unit 125-2. Unlike the configuration of the defect detection device 1050 described with reference to FIG. 1 according to the first embodiment, the defect detection device 1052 according to the present embodiment does not include the multi-shutter device 204 on the objective lens 203, and includes the multi-shutter device 204-2 in the vertical illumination optical system 202-2.

The vertical illumination optical system 202-2 includes the illumination light source 207, the lens 208 that shapes light emitted from the illumination light source 207, the multi-shutter device 204B disposed on the pupil plane 325 of the illumination light source 207, and the half mirror 209 that reflects a part of the light transmitted through the lens 208 toward the wafer 101. The configuration of the multi-shutter device 204B is the same as that of the multi-shutter device 204 described according to the first embodiment, or the multi-shutter device 204-1, or the multi-shutter device 204-2.

As described above, the defect detection device according to the present embodiment includes an illumination optical system configured to irradiate a wafer with light, a detection optical system configured to image scattered light generated on the wafer by the irradiation of the light, and an image capturing device configured to capture an image of the scattered light imaged by the imaging lens. The illumination optical system includes a multi-shutter device. The multi-shutter device includes a first microlens array that condenses parallel light, a second microlens array that converts the light condensed by the first microlens array and spread into the parallel light, and a shutter array disposed at focus positions of the first microlens array and the second microlens array between the first microlens array and the second microlens array. The shutter array can individually and electrically switch each shutter constituting the shutter array between light shielding and transmission, and when a focus length of a lens constituting the first microlens array is f1 and a focus length of a lens constituting the second microlens array is f2, f1≥f2.

According to the present embodiment, by controlling the transmission and light shielding unit of the multi-shutter device, it is possible to control the illumination NA, the size of the illumination spot, and the like.

Sixth Embodiment

FIG. 19 shows an example of a configuration of a defect detection device 1053 according to a sixth embodiment of the invention. In the present embodiment, a multi-shutter device 204A or 204B is disposed on a pupil plane 301A of a detection optical system of an optical microscope unit 105-3 and on the pupil plane 325 of the illumination light source 207 of a vertical illumination optical system 202-3.

A basic configuration of the defect detection device 1053 according to the present embodiment is substantially the same as the configuration of the defect detection device 1050 described with reference to FIG. 1 according to the first embodiment, and the same components are denoted by the same reference numerals. In order to avoid redundant description, only differences from the defect detection device 1050 described with reference to FIG. 1 will be described below.

The optical microscope unit 105-3 of the defect detection device 1053 in the present embodiment includes the vertical illumination optical system 202-3 between the objective lens 203 and the imaging lens 205, and is connected to a network 121-3, a database 122-3, a user interface 123-3, a storage device 124-3, and a control system unit 125-3. Unlike the configuration of the defect detection device 1050 described with reference to FIG. 1 according to the first embodiment, the defect detection device 1053 according to the present embodiment includes the multi-shutter device 204A between the vertical illumination optical system 202-2 and the imaging lens 205 above the objective lens 203, and further includes the multi-shutter device 204-B in the vertical illumination optical system 202-2.

In the defect detection device 1053 according to the present embodiment, the control system unit 125-3 controls transmission and light shielding units of the multi-shutter devices 204A, 204B, so that it is possible to control the illumination NA and the size of the illumination spot, improve the defect detection sensitivity, classify the defects, and the like. The basic configuration and effects are a combination of the first and fifth embodiments described with reference to FIGS. 1 and 13, and thus the description thereof will be omitted.

As a new effect according to the present embodiment, dark-field detection with a high degree of freedom in a two-dimensional manner can be executed. It is possible to detect a dark field by shielding a region transmitted by the multi-shutter device 204B disposed on the pupil plane 325 of the light source with the multi-shutter device 204A on the pupil plane 301 of the detection optical system.

Seventh Embodiment

Each of the multi-shutter devices 204, 204-1, 204-2, 204A, and 204B described according to the first embodiment to the sixth embodiment has a function as a spatial filter. A multi-shutter device 204-3 according to a seventh embodiment has a polarization control function and a polarization selection function in addition to the spatial filter function. Accordingly, the scattered light from the wafer and the scattered light from the defect can be further discriminated, and the defect detection sensitivity can be further improved. Effects of polarization control and polarization selection is described in detail in PTL 1.

FIG. 20 shows an example of the multi-shutter device 204-3 according to the seventh embodiment. The multi-shutter device 204-3 includes at least two microlens arrays 211, 213, a phase modulation element 236, a polarizer 237, and the shutter array 212. The microlens arrays 211, 213 and the shutter array 212 are same as those described according to the first embodiment to the sixth embodiment. Instead of the shutter array 212, the MEMS shutter array 220 described with reference to FIGS. 6 and 7 according to the first embodiment may be used.

A case will be described in which the multi-shutter device 204-3 according to the present embodiment is applied to the optical microscope unit 105 described according to the first embodiment with reference to FIG. 1. In the optical microscope unit 105, light that is reflected and scattered by the wafer 101, that is collected by the objective lens 203, and that is made into parallel light is incident on the multi-shutter device 204-3.

The light incident on the multi-shutter device 204-3 passes through the polarizer 237 of which a polarization direction is controlled by the phase modulation element 236 and which transmits only light in a specific polarization direction, passes through the microlens array 211, the shutter array 212, and the microlens array 213, and is emitted from the multi-shutter device 204-3. The light emitted from the multi-shutter device 204-3 is incident on the imaging lens 205 and forms an image on the detector 206.

The phase modulation element 236 of the multi-shutter device 204-3 according to the present embodiment is, for example, a combination of half-wavelength plates, a photonic crystal, a liquid crystal, or the like. The polarizer 237 is, for example, a polarizing plate, a polarizing beam splitter (PBS), a photonic crystal, or the like.

FIG. 21 shows an example of a multi-shutter device 204-4 using a liquid crystal shutter array as a modification of the seventh embodiment. The multi-shutter device 204-4 according to the present embodiment includes at least two microlens arrays 211, 213, the phase modulation element 236 disposed between the microlens arrays 211, 213, and a shutter array 212-1. The shutter array 212-1 has the same configuration as that of the shutter array 212 described with reference to FIGS. 8 and 9 according to the first embodiment, and includes polarizing plates 224, 226, and a liquid crystal 225 that is disposed between the polarizing plates 224, 226 and that serves as a phase modulation element capable of being electrically turned ON and OFF.

The liquid crystal 225 serving as the phase modulation element of the shutter array 212-1 is a liquid crystal in which rubbing grooves are formed in a concentric direction or a radial direction with respect to a center of the optical axis of the detection optical system 110 of the optical microscope unit 105. On the other hand, the phase modulation element 236 immediately after the microlens array 211 is a liquid crystal in which rubbing grooves arranged in parallel are formed, similarly to the liquid crystal 225 described with reference to FIGS. 8 and 9.

The number of each element shown in FIGS. 20 and 21 is 3 for simplification. However, the number of each element is actually 10×10 or more, and the number of each element is not limited to the number shown in the drawings.

According to the present embodiment, since the deflection direction of the light incident on the imaging lens 205 can be selected, the scattered light from the defect can be detected in a state in which scattered light from minute unevenness of the surface of the wafer 101 is blocked, and a noise component can be reduced to improve the defect detection sensitivity. Accordingly, it is possible to accurately detect a finer defect with more accurate position information. As described above, the invention made by the present inventors are specifically described based on the embodiments. However, the invention is not limited to the embodiments, and various modifications can be made without departing from the gist of the invention. For example, the above description is limited to the example in which the SEM image is acquired as the image for a purpose of the defect observation. However, the image for the purpose of the defect observation is not limited to the SEM image, and a high-magnification optical microscope image may be acquired. The defect detection device on which the multi-shutter device 204 according to the seventh embodiment is mounted may be mounted on the defect observation apparatus.

REFERENCE SIGN LIST

101 . . . sample (wafer)
102, 1020 . . . sample holder
103, 1030 . . . stage
105, 105-1, 105-2, 105-3 . . . optical microscope unit
106 . . . SEM unit
110 . . . detection optical system
122, 122-1, 122-2, 122-3, 1220 . . . database
123, 123-1, 123-2, 123-3, 1230 . . . user interface
124, 124-1, 124-2, 124-3, 1240 . . . storage device
125, 125-1, 125-2, 125-3, 1250 . . . control system unit
151 . . . electron beam source
155 . . . objective lens electrode (SEM)
156 . . . secondary electron detector
157 . . . reflected electron detector
201 . . . oblique illumination optical system
202, 202-2, 202-3 . . . vertical illumination optical system
203 . . . objective lens
204, 204-1, 204-2, 204-3, 204-4, 204A, 204B . . . multi-shutter device
205 . . . imaging lens
206 . . . detector
207 . . . illumination light source
208 . . . lens
209 . . . half mirror
210 . . . height control mechanism
211, 211-1, 211A, 211B, 213, 213-1, 213A, 213B . . . microlens array
212, 212-1, 212A, 212B . . . shutter array
215, 216 . . . microlens
217 . . . shutter
220 . . . MEMS shutter array
224, 226 . . . polarizing plate
225 . . . liquid crystal
236 . . . phase modulation element
231 . . . half mirror
232, 233 . . . relay lens
234 . . . image capturing device
235 . . . Fourier transform plane observation system
236 . . . phase modulation element
237 . . . polarizer
1050, 1051 . . . defect detection device
1000 . . . defect observation apparatus

The invention claimed is:

1. A defect detection device comprising:
an illumination optical system configured to irradiate a wafer with light;
an image capturing optical system configured to capture an image of scattered light generated on the wafer irradiated with light by the illumination optical system; and
an image processing unit configured to process a picture of the image of the scattered light obtained by capturing by the image capturing optical system to extract a defect on the wafer, wherein
the image capturing optical system includes
an objective lens,
a filter unit configured to shield a part of light transmitted through the objective lens, and
an imaging lens configured to form an image of light transmitted through the filter unit on an image capturing device, and
the filter unit includes
a first microlens array configured to condense parallel light transmitted through the objective lens,
a shutter array including a light transmission unit at a focus position of the first microlens array, and
a second microlens array disposed on a side opposite to the first microlens array with respect to the shutter array,
wherein the first microlens array and the second microlens array are arranged such that the first microlens array is disposed at a first focus length with respect to the shutter array, and the second microlens array is disposed at a second focus length with respect to the shutter array, and
wherein the first focus length is equal to or greater than the second focus length.

2. The defect detection device according to claim 1, wherein
a focus length of a lens constituting the second microlens array of the filter unit is smaller than a focus length of a lens constituting the first microlens array.

3. The defect detection device according to claim 1, wherein
the filter unit is disposed on a pupil plane of the objective lens of the image capturing optical system.

4. The defect detection device according to claim 1, wherein
the shutter array of the filter unit is formed of a liquid crystal device.

5. The defect detection device according to claim 1, wherein
the shutter array of the filter unit is formed of a MEMS including a shutter that is opened and closed based on an electric signal.

6. The defect detection device according to claim 1, further comprising:
a control unit, wherein
the control unit controls the shutter array of the filter unit to change a light shielding pattern that partially shields light transmitted through the shutter array according to a type of a defect on the wafer to be extracted.

7. A defect detection method comprising:
irradiating a wafer with light by an illumination optical system;
capturing, by an image capturing optical system, an image of scattered light generated on the wafer irradiated with light by the illumination optical system; and
processing, with an image processing unit, a picture of the image of the scattered light obtained by capturing by the image capturing optical system to extract a defect on the wafer, wherein
the capturing the image of the scattered light by the imaging optical system is executed by causing light transmitted through an objective lens of the image capturing optical system to be incident on a filter unit and causing light transmitted through the filter unit to form an image on an image capturing device by an imaging lens, and
the light transmitted through the filter unit is light that parallel light transmitted through the objective lens is condensed by a first microlens array, and in the light condensed by the first microlens array, the light transmitted through a shutter array including a light transmission unit at a focus position of the first microlens array and is made into parallel light by a second microlens array, wherein the first microlens array and the second microlens array are arranged such that the first microlens array is disposed at a first focus length with respect to the shutter array, and the second microlens array is disposed at a second focus length with respect to the shutter array, and wherein the first focus length is equal to or greater than the second focus length.

8. The defect detection method according to claim 7, wherein the shutter array of the filter unit is formed of a liquid crystal device.

9. The defect detection method according to claim 7, wherein the shutter array of the filter unit is formed of a MEMS including a shutter that is opened and closed based on an electric signal.

10. The defect detection method according to claim 7, wherein a control unit controls the shutter array of the filter unit to change a light shielding pattern that partially shields light transmitted through the shutter array according to a type of a defect on the wafer to be extracted.

11. A defect observation apparatus comprising:

an optical microscope unit;

a scanning electron microscope unit;

a stage unit on which a sample is placed and which is configured to move between the optical microscope unit and the scanning electron microscope unit; and a control system unit configured to control the optical microscope unit, the scanning electron microscope unit, and the stage unit, wherein the optical microscope unit includes an illumination optical system configured to irradiate a wafer with light, an image capturing optical system configured to capture an image of scattered light generated on the wafer irradiated with light by the illumination optical system, and an image processing unit configured to process a picture of the image of the scattered light obtained by capturing by the image capturing optical system to extract a defect on the wafer, the imaging optical system includes an objective lens, a filter unit configured to shield a part of light transmitted through the objective lens, and an imaging lens configured to form an image of light transmitted through the filter unit on an image capturing device, and the filter unit includes a first microlens array configured to condense parallel light transmitted through the objective lens, a shutter array including a light transmission unit at a focus position of the first microlens array, and a second microlens array disposed on a side opposite to the first microlens array with respect to the shutter array, wherein the first microlens array and the second microlens array are arranged such that the first microlens array is disposed at a first focus length with respect to the shutter array, and the second microlens array is disposed at a second focus length with respect to the shutter array, and wherein the first focus length is equal to or greater than the second focus length.

12. The defect observation apparatus according to claim 11, wherein a focus position of the lens constituting the first microlens array and a focus position of the lens constituting the second microlens array are both set in the light transmission unit of the shutter array.

13. The defect observation apparatus according to claim 11, wherein the shutter array of the filter unit is formed of a liquid crystal device or a MEMS including a shutter that is opened and closed based on an electric signal.

* * * * *